US012610699B2

(12) United States Patent
Fang et al.

(10) Patent No.: US 12,610,699 B2
(45) Date of Patent: Apr. 21, 2026

(54) DISPLAY SUBSTRATE HAVING FUNCTIONAL DEVICE SETTING REGION AND DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Fei Fang, Beijing (CN); Ke Liu, Beijing (CN); Dan Guo, Beijing (CN); Ling Shi, Beijing (CN); Xuewei Tian, Beijing (CN); Puyu Qi, Beijing (CN); Shuai Ai, Beijing (CN); Jingjing Xu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 285 days.

(21) Appl. No.: 18/251,938

(22) PCT Filed: May 26, 2022

(86) PCT No.: PCT/CN2022/095374
§ 371 (c)(1),
(2) Date: May 5, 2023

(87) PCT Pub. No.: WO2023/225966
PCT Pub. Date: Nov. 30, 2023

(65) Prior Publication Data
US 2024/0349550 A1      Oct. 17, 2024

(51) Int. Cl.
*H01L 29/08* (2006.01)
*H10K 59/121* (2023.01)
(Continued)

(52) U.S. Cl.
CPC ....... *H10K 59/126* (2023.02); *H10K 59/1213* (2023.02); *H10K 59/1216* (2023.02);
(Continued)

(58) Field of Classification Search
CPC ............... H10K 59/126; H10K 59/131; H10K 59/1213; H10K 59/1216; G09G 3/3233;
(Continued)

(56) References Cited

U.S. PATENT DOCUMENTS

2017/0337873 A1* 11/2017 Kim ..................... G09G 3/3233
2020/0013345 A1* 1/2020 Jeong ................... G09G 3/3291
(Continued)

FOREIGN PATENT DOCUMENTS

CN          109979980 A      7/2019
CN          110717580 A      1/2020
(Continued)

OTHER PUBLICATIONS

PCT International Search Report and Written Opinion (w/ English translations) for corresponding PCT Application No. PCT/CN2022/096458, mailed Nov. 25, 2022, 19 pages.
(Continued)

*Primary Examiner* — Phuc T Dang
(74) *Attorney, Agent, or Firm* — Dority & Manning, P.A.

(57)          ABSTRACT

A display substrate includes a substrate, scan signal lines, a plurality of first pixel circuits and a plurality of first light-emitting devices. The plurality of first pixel circuits are disposed on the substrate, and are located in a functional device setting region. At least one first pixel circuit includes a first transistor. At least one first light-emitting device includes a first electrode. The at least one first light-emitting device includes at least one first color light-emitting device, and the at least one first pixel circuit includes at least one first color pixel circuit, and a first color pixel circuit is (Continued)

electrically connected to a first color light-emitting device. An orthographic projection of a channel region of a first transistor in the first color pixel circuit on the substrate is at least partially overlapped with an orthographic projection of a first electrode of the first color light-emitting device on the substrate.

19 Claims, 12 Drawing Sheets

(51) Int. Cl.
| | |
|---|---|
| *H10K 59/126* | (2023.01) |
| *H10K 59/131* | (2023.01) |
| *G09G 3/3233* | (2016.01) |

(52) U.S. Cl.
CPC ......... *H10K 59/131* (2023.02); *G09G 3/3233* (2013.01); *G09G 2300/0426* (2013.01); *G09G 2300/0819* (2013.01); *G09G 2300/0842* (2013.01); *G09G 2310/08* (2013.01); *G09G 2320/045* (2013.01)

(58) Field of Classification Search
CPC ... G09G 2300/0426; G09G 2300/0819; G09G 2300/0842; G09G 2310/08; G09G 2320/045
USPC .......................................................... 257/40
See application file for complete search history.

(56) References Cited

U.S. PATENT DOCUMENTS

| | | |
|---|---|---|
| 2021/0005669 A1 | 1/2021 | Kamada et al. |
| 2021/0118962 A1 | 4/2021 | Shin et al. |
| 2021/0193741 A1 | 6/2021 | Chen |
| 2021/0202621 A1 | 7/2021 | Liang et al. |
| 2021/0265434 A1 | 8/2021 | Wu et al. |
| 2021/0334504 A1 | 10/2021 | Lu |
| 2021/0335221 A1 | 10/2021 | Ma et al. |
| 2021/0408194 A1 | 12/2021 | Zhang |
| 2022/0059805 A1 | 2/2022 | Cho et al. |
| 2022/0208863 A1 | 6/2022 | Cho et al. |
| 2022/0246688 A1 | 8/2022 | Park |
| 2022/0320183 A1 | 10/2022 | Bao et al. |
| 2022/0320214 A1 | 10/2022 | Qu et al. |
| 2022/0320226 A1 | 10/2022 | Yang et al. |
| 2022/0344432 A1 | 10/2022 | Shi et al. |
| 2022/0376003 A1 | 11/2022 | Wang et al. |
| 2022/0376028 A1 | 11/2022 | Huang et al. |
| 2022/0415981 A1 | 12/2022 | Shu et al. |
| 2023/0039372 A1 | 2/2023 | Wu |
| 2023/0099301 A1 | 3/2023 | Chen et al. |

FOREIGN PATENT DOCUMENTS

| | | | | |
|---|---|---|---|---|
| CN | 210575037 U | | 5/2020 | |
| CN | 111725288 A | | 9/2020 | |
| CN | 111739916 A | | 10/2020 | |
| CN | 113097281 A | | 7/2021 | |
| CN | 113161402 A | | 7/2021 | |
| CN | 113285044 A | | 8/2021 | |
| CN | 113437126 A | | 9/2021 | |
| CN | 113540200 A | | 10/2021 | |
| CN | 113674693 A | | 11/2021 | |
| CN | 114005864 A | | 2/2022 | |
| CN | 114093898 A | | 2/2022 | |
| CN | 114156308 A | * | 3/2022 | ........... H10K 50/865 |
| EP | 3660827 A1 | | 6/2020 | |
| EP | 4095937 A1 | | 11/2022 | |
| WO | WO-2021217994 A1 | * | 11/2021 | ........... G09G 3/3241 |

OTHER PUBLICATIONS

PCT International Search Report and Written Opinion (w/ English translations) for corresponding PCT Application No. PCT/CN2022/096459, mailed Dec. 14, 2022, 18 pages.

U.S. Non-Final Office Action for corresponding U.S. Appl. No. 18/043,914, dated Aug. 13, 2025, 27 pages.

* cited by examiner

DISPLAY SUBSTRATE HAVING FUNCTIONAL DEVICE SETTING REGION AND DISPLAY APPARATUS

CROSS-REFERENCE TO RELATED APPLICATION

This application is a national phase entry under 35 USC 371 of International Patent Application No. PCT/CN 2022/095374 filed on May 26, 2022, which is incorporated herein by reference in its entirety.

TECHNICAL FIELD

The present disclosure relates to the field of display technologies, and in particular, to a display substrate and a display apparatus.

BACKGROUND

With the rapid development of display technologies, display apparatuses have gradually spread in people's lives. Organic light-emitting diodes (OLEDs) are widely used in smart products such as mobile phones, televisions and notebook computers due to their advantages of self-luminescence, low power consumption, wide viewing angle, fast response speed, high contrast and flexible display.

SUMMARY

In an aspect, a display substrate is provided. The display substrate has a functional device setting region and a main display region at least partially surrounding the functional device setting region. A light transmittance of the functional device setting region is greater than a light transmittance of the main display region. The display substrate includes a substrate, scan signal lines, a plurality of first pixel circuits and a plurality of first light-emitting devices. The scan signal lines are disposed on the substrate. The plurality of first pixel circuits are disposed on the substrate, and are located in the functional device setting region. At least one first pixel circuit includes a first transistor and a driving transistor. A control electrode of the first transistor is electrically connected to a scan signal line, a first electrode of the first transistor is electrically connected to a second electrode of the driving transistor, and a second electrode of the first transistor is electrically connected to a control electrode of the driving transistor. The plurality of first light-emitting devices are disposed on a side of the plurality of first pixel circuits away from the substrate, and are located in the functional device setting region. At least one first light-emitting device includes a first electrode, a first electrode of a first light-emitting device in the at least one first light-emitting device is electrically connected to a first pixel circuit in the at least one first pixel circuit.

The at least one first light-emitting device includes at least one first color light-emitting device, and the at least one first pixel circuit includes at least one first color pixel circuit, and a first color pixel circuit is electrically connected to a first color light-emitting device. An orthographic projection of a channel region of a first transistor in the first color pixel circuit on the substrate is at least partially overlapped with an orthographic projection of a first electrode of the first color light-emitting device on the substrate.

In some embodiments, a first electrode of each of the at least one first color light-emitting device includes a body portion that is substantially in a shape of a long strip. The at least one first color light-emitting device includes a plurality of first color light-emitting devices including first color sub-light-emitting devices and second color sub-light-emitting devices. A first color sub-light-emitting device has a long side in a first oblique direction, and a second color sub-light-emitting device has a long side in a second oblique direction. The first oblique direction and the second oblique direction intersect. One of the first color sub-light-emitting device and the second color sub-light-emitting device is a set light-emitting device, and a first electrode of the set light-emitting device further includes a first light-shielding portion. The orthographic projection, on the substrate, of the channel region of the first transistor in the first color pixel circuit electrically connected to the set light-emitting device is located within an orthographic projection of the first light-shielding portion on the substrate.

In some embodiments, of the first electrode of the set light-emitting device, a body portion includes a first long side and a second long side arranged opposite to each other, and the first light-shielding portion is located on a side of the first long side of the body portion away from the second long side and is connected to the first long side of the body portion. The orthographic projection, on the substrate, of the channel region of the first transistor in the first color pixel circuit electrically connected to the set light-emitting device is located on a side of an orthographic projection of the first long side of the body portion on the substrate away from an orthographic projection of the second long side on the substrate.

In some embodiments, another one of the first color sub-light-emitting device and the second color sub-light-emitting device except the set light-emitting device is a non-set light-emitting device. An orthographic projection, on the substrate, of a channel region of a first transistor in a first color pixel circuit in the at least one first color pixel circuit electrically connected to the non-set light-emitting device is located within an orthographic projection of a body portion of a first electrode of the non-set light-emitting device on the substrate.

In some embodiments, in a direction perpendicular to the substrate and away from the substrate, the display substrate sequentially includes a first gate conductive layer, a second gate conductive layer and a first source-drain conductive layer. The first pixel circuit further includes a storage capacitor, and the storage capacitor of the first pixel circuit includes a first electrode plate located in the first gate conductive layer and a second electrode plate located in the second gate conductive layer. The second electrode plate of the storage capacitor in the first pixel circuit has a solid structure, and an orthographic projection of the second electrode plate of the storage capacitor in the first pixel circuit on the substrate is partially overlapped with an orthographic projection of the first electrode plate of the storage capacitor in the first pixel circuit on the substrate. The first electrode plate of the storage capacitor in the first pixel circuit has a portion whose orthographic projection on the substrate is non-overlapped with the orthographic projection of the second electrode plate in the first pixel circuit on the substrate. The display substrate further includes a second connection line located in the first source-drain conductive layer. The second connection line is electrically connected to the portion of the first electrode plate of the storage capacitor in the first pixel circuit whose orthographic projection on the substrate is non-overlapped with the orthographic projection of the second electrode plate on the substrate, and is electrically connected to the second electrode of the first transistor.

In some embodiments, the first pixel circuit further includes a sixth transistor. A control electrode of the sixth transistor is electrically connected to a scan signal terminal, a first electrode of the sixth transistor is electrically connected to an initialization signal terminal, and a second electrode of the sixth transistor is electrically connected to the first electrode of the first light-emitting device. The display substrate further includes a fourth connection line located in the first source-drain conductive layer, and the fourth connection line is electrically connected to the first electrode of the first light-emitting device and the second electrode of the sixth transistor.

In some embodiments, the display substrate further includes a transparent conductive layer and a first voltage signal line. The transparent conductive layer is disposed on a side of the first source-drain conductive layer away from the substrate. The first voltage signal line is electrically connected to the first pixel circuit. The first voltage signal line includes a first sub-voltage wiring and a fifth transfer line located in the functional device setting region. The fifth transfer line is disposed on a side of the first pixel circuit away from the substrate, and is electrically connected to the first sub-voltage wiring. The first sub-voltage wiring is located in the transparent conductive layer, and is electrically connected to the second electrode plate of the storage capacitor.

Orthographic projections of the first electrode plate of the storage capacitor and the second connection line on the substrate are overlapped with orthographic projections of the second electrode plate of the storage capacitor and the first sub-voltage wiring on the substrate.

In some embodiments, the first voltage signal line further includes a second sub-voltage wiring located in the main display region, and the second sub-voltage wiring is located in the first source-drain conductive layer. The display substrate further includes a plurality of second light-emitting devices, a second source-drain conductive layer, a support pattern and a data line. The plurality of second light-emitting devices are located in the main display region, and the second source-drain conductive layer is disposed on a side of the transparent conductive layer away from the substrate. The data line includes a second sub-data line located in the main display region. The second sub-data line and the support pattern are located in the second source-drain conductive layer, and the support pattern includes a first sub-support portion extending in a second direction and a second sub-support portion extending in a first direction. The first direction is approximately perpendicular to the second direction; the first oblique direction and the second oblique direction each intersect with the first direction and the second direction. An orthographic projection of a first electrode of a second light-emitting device on the substrate is overlapped with orthographic projections of the second sub-data line and the second sub-support portion on the substrate.

In some embodiments, the first pixel circuits are arranged in a plurality of rows each including first pixel circuits arranged in a second direction. In a first direction, first pixel circuits in a row are staggered from first pixel circuits in an adjacent row. The first direction is approximately perpendicular to the second direction. The first oblique direction and the second oblique direction each intersect with the first direction and the second direction.

In some embodiments, the first electrode of each of the at least one first color light-emitting device further includes a connection portion electrically connected to a first color pixel circuit in the at least one first color pixel circuit.

In some embodiments, the at least one first light-emitting device further includes a plurality of second color light-emitting devices and a plurality of third color light-emitting devices. The at least one first pixel circuit further includes a second color pixel circuit electrically connected to a second color light-emitting device and a third color pixel circuit electrically connected to a third color light-emitting device. Orthographic projections of channel regions of first transistors in the second color pixel circuit and the third color pixel circuit on the substrate are respectively located within orthographic projections of first electrodes of the second color light-emitting device and the third color light-emitting device on the substrate.

In some embodiments, the display substrate further includes a plurality of second pixel circuits and a plurality of second light-emitting devices. The plurality of second pixel circuits are disposed on the substrate, and are located in the main display region. The second pixel circuits each include a first transistor and a driving transistor. A control electrode of a first transistor in a second pixel circuit is electrically connected to a scan signal line, a first electrode of the first transistor in the second pixel circuit is electrically connected to a second electrode of the driving transistor in the second pixel circuit, and a second electrode of the first transistor in the second pixel circuit is electrically connected to a control electrode of a driving transistor in the second pixel circuit. The plurality of second light-emitting devices are disposed on a side of the second pixel circuits away from the substrate, and are located in the main display region. Each second light-emitting device includes a first electrode electrically connected to a second pixel circuit in the plurality of second pixel circuits. Orthographic projections of channel regions of first transistors in the plurality of second pixel circuits on the substrate are respectively located within orthographic projections of first electrodes of the plurality of second light-emitting devices on the substrate.

In some embodiments, the second pixel circuits are arranged in a plurality of rows each including second pixel circuits arranged in a second direction. In a first direction, second pixel circuits in a row are aligned with second pixel circuits in an adjacent row.

The first direction is approximately perpendicular to the second direction.

In some embodiments, the plurality of second light-emitting devices include second color light-emitting devices, third color light-emitting devices, first color sub-light-emitting devices and second color sub-light-emitting devices. The plurality of second pixel circuits include a plurality of second pixel circuit groups, and each second pixel circuit group includes a second color pixel circuit electrically connected to a second color light-emitting device, a third color pixel circuit electrically connected to a third color light-emitting device, a first sub-pixel circuit electrically connected to a first color sub-light-emitting device, and a second sub-pixel circuit electrically connected to a second color sub-light-emitting device. The first sub-pixel circuit, the second color pixel circuit, the second sub-pixel circuit, and the third color pixel circuit are arranged in sequence in the second direction.

In some embodiments, a first electrode of the second color light-emitting device includes a body portion substantially in a shape of rhombus. Two diagonal lines of the rhombus are approximately parallel to the first direction and the second direction, respectively. The first electrode of the second color light-emitting device further includes a second light-shielding portion. An orthographic projection of a channel region of a first transistor in the second sub-pixel circuit on the substrate is located within an orthographic projection of the second light-shielding portion on the substrate.

In some embodiments, the first electrode of the second color light-emitting device further includes a third light-shielding portion. An orthographic projection of a channel region of a first transistor in the second color pixel circuit on the substrate is located within an orthographic projection of the third light-shielding portion on the substrate.

In some embodiments, the body portion of the first electrode of the second color light-emitting device includes a first border, a second border, a third border and a fourth border connected in sequence.

The second light-shielding portion is located on a side of the first border of the body portion away from the third border and connected to the first border of the body portion, and the first transistor in the second sub-pixel circuit is located on the side of the first border of the body portion away from the third border; and/or the third light-shielding portion is located on a side of the second border of the body portion away from the fourth border and connected to the second border of the body portion, and the first transistor in in the second color pixel circuit is located on the side of the second border of the body portion away from the fourth border.

In some embodiments, a first electrode of the third color light-emitting device includes a body portion substantially in a shape of a rhombus. Two diagonal lines of the rhombus are approximately parallel to the first direction and the second direction, respectively. The first electrode of the third color light-emitting device further includes a fourth light-shielding portion. An orthographic projection of a channel region of a first transistor in the first sub-pixel circuit on the substrate is located within an orthographic projection of the fourth light-shielding portion on the substrate.

The first electrode of the third color light-emitting device further includes a fifth light-shielding portion. An orthographic projection of a channel region of a first transistor in the third color pixel circuit on the substrate is located within an orthographic projection of the fifth light-shielding portion on the substrate.

In some embodiments, the body portion of the first electrode of the third color light-emitting device includes a first border, a second border, a third border and a fourth border connected in sequence.

The fourth light-shielding portion is located on a side of the first border of the body portion away from the third border and connected to the first border of the body portion, and the first transistor in the first sub-pixel circuit is located on the side of the first border of the body portion away from the third border; and/or the fifth light-shielding portion is located on a side of the second border of the body portion away from the fourth border and connected to the second border of the body portion, and the first transistor in the third color pixel circuit is located on the side of the second border of the body portion away from the fourth border.

In some embodiments, borders of corners of the first electrode are arc-shaped.

In some embodiments, the scan signal line includes a first scan wiring and a first transfer line. The first transfer line is electrically connected to the first pixel circuit. An end of the first scan wiring extends into the functional device setting region, and is electrically connected to the first transfer line.

In some embodiments, the display substrate further includes a reset signal line, an enable signal line and an initialization signal line. The reset signal line is configured to transmit a reset signal, and includes a first reset wiring and a second transfer line. The second transfer line extends substantially in a second direction, and is electrically connected to the first pixel circuit. An end of the first reset wiring extends into the functional device setting region, and is electrically connected to the second transfer line.

The enable signal line is configured to transmit an enable signal, and includes a first enable wiring and a third transfer line. The third transfer line extends substantially in the second direction, and is electrically connected to the first pixel circuit. An end of the first enable wiring extends into the functional device setting region, and is electrically connected to the third transfer line.

The initialization signal line is configured to transmit an initialization signal, and includes a first initialization wiring and a fourth transfer line. The fourth transfer line extends substantially in the second direction, and is electrically connected to the first pixel circuit. An end of the first initialization wiring extends into the functional device setting region, and is electrically connected to the fourth transfer line.

In some embodiments, a portion, located in the functional device setting region, of each of the first scan wiring, the first reset wiring, the first enable wiring and the first initialization wiring is transparent; and/or a material of each of the first transfer line, the second transfer line, the third transfer line, and the fourth transfer line includes metal.

In some embodiments, in a direction perpendicular to the substrate and away from the substrate, the display substrate sequentially includes a semiconductor layer, a first gate conductive layer, a second gate conductive layer, a first source-drain conductive layer and a transparent conductive layer. The first transfer line, the second transfer line and the third transfer line are located in the first gate conductive layer, and the fourth transfer line is located in the second gate conductive layer; and/or a portion, located in the functional device setting region, of each of the first scan wiring, the first reset wiring, the first enable wiring and the first initializing wiring is located in the transparent conductive layer.

In some embodiments, the display substrate further includes a first voltage signal line and a data line. The first voltage signal line and the data line extend substantially in a first direction, and are electrically connected to the first pixel circuit. At least a portion, located in the functional device setting region, of each of the first voltage signal line and the data line is transparent.

In some embodiments, the first voltage signal line includes a first voltage wiring and a fifth transfer line. The fifth transfer line is disposed on a side of the first pixel circuit away from the substrate, and is electrically connected to the first voltage wiring.

In a direction perpendicular to the substrate and away from the substrate, the display substrate sequentially includes a semiconductor layer, a first gate conductive layer, a second gate conductive layer, a first source-drain conductive layer, a transparent conductive layer and a second source-drain conductive layer. A portion, located in the functional device setting region, of each of the first voltage wiring and the data line is located in the transparent conductive layer, and the fifth transfer line is located in the second source-drain conductive layer.

In another aspect, a display apparatus is provided. The display apparatus includes a housing and the display substrate in the above embodiments. The display substrate is disposed in the housing.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method, and an actual timing of a signal involved in the embodiments of the present disclosure.

DETAILED DESCRIPTION

Figure 1:
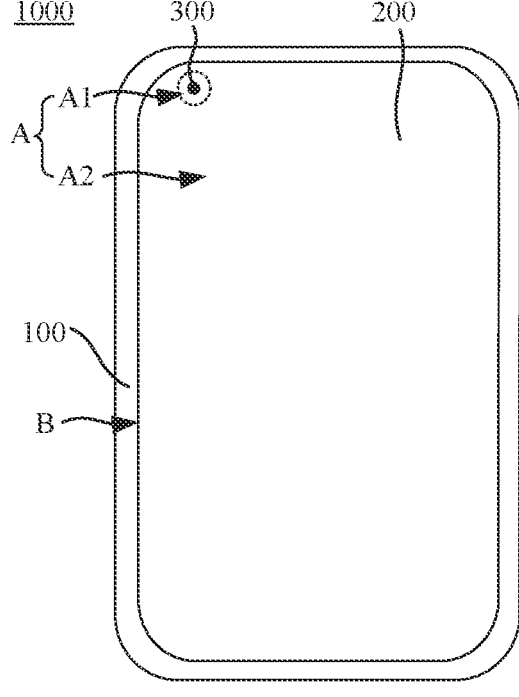
FIG. 1 is a structural diagram of a display apparatus, in accordance with some embodiments.

Technical solutions in some embodiments of the present disclosure will be described clearly and completely below with reference to the accompanying drawings.

Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms such as "connected" and "electrically connected" and extensions thereof may be used. For example, the term "connected" may be used in the description of some embodiments to indicate that two or more components are in direct physical or electrical contact with each other. The embodiments disclosed herein are not necessarily limited to the contents herein. For another example, the term "electrically connected" may be used in the description of some embodiments to indicate that two or more components are in direct electrical contact with each other or are indirectly electrically connected. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of the phrase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "parallel," "perpendicular" or "equal" includes a stated condition and condition(s) similar to the stated condition. The similar condition(s) are within an acceptable range of deviation as determined by a person of ordinary skill in the art, considering measurement in question and errors associated with measurement of a particular quantity (i.e., limitations of a measurement system). For example, the term "parallel" includes "absolutely parallel" and "approximately parallel", and for the phrase "approximately parallel", an acceptable range of deviation may be, for example, within 5°. The term "perpendicular" includes "absolutely perpendicular" and "approximately perpendicular", and for the phrase "approximately perpendicular", an acceptable range of deviation may also be, for example, within 5°. The term "equal" includes "absolutely equal" and "approximately equal", and for the phrase "approximately equal", an acceptable range of deviation may be that, for example, a difference between two that are equal to each other is less than or equal to 5% of any one of the two.

It will be understood that when a layer or element is described as being on another layer or substrate, the layer or element may be directly on the another layer or substrate, or intermediate layer(s) may exist between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature.

Therefore, the regions shown in the accompanying drawings are schematic in nature, and their shapes are not intended to show actual shapes of the regions in a device, and are not intended to limit the scope of the exemplary embodiments.

Transistors in pixel driving circuits (i.e., pixel circuits) provided in the embodiments of the present disclosure may be thin film transistors (TFTs), field effect transistors (e.g., metal-oxide semiconductor field effect transistors, MOS-FETs) or other switching devices with same properties. In the embodiments of the present disclosure, the thin film transistors are taken as an example for description.

Herein, a control electrode of each thin film transistor in a pixel driving circuit (i.e., pixel circuit) is a gate of the thin film transistor, a first electrode of the thin film transistor is one of a source and a drain of the thin film transistor, and a second electrode of the thin film transistor is another one of the source and the drain of the thin film transistor. Since the source and the drain of the thin film transistor may be symmetrical in structure, the source and the drain of the thin film transistor may be the same in structure. That is, the first electrode and the second electrode of the thin film transistor in the embodiments of the present disclosure may be the same in structure. For example, in a case where the thin film transistor is a P-type transistor, the first electrode of the thin film transistor is a source, and the second electrode of the thin film transistor is a drain. For example, in a case where the thin film transistor is an N-type transistor, the first electrode of the thin film transistor is a drain, and the second electrode of the thin film transistor is a source.

In the pixel driving circuits (i.e., pixel circuits) provided in the embodiments of the present disclosure, a capacitor may be a capacitive device separately manufactured by a process. For example, the capacitive device is realized by manufacturing special capacitive electrodes, and each capacitive electrode of the capacitor may be realized by a metal layer or a semiconductor layer (e.g., doped with polysilicon). Alternatively, the capacitor may be realized by a parasitic capacitance between transistors, or by a parasitic capacitance between a transistor itself and other device or wiring, or by a parasitic capacitance between wirings of a circuit itself.

Referring to FIG. 1, some embodiments of the present disclosure provide a display apparatus 1000. The display apparatus 1000 may be any apparatus that displays text or images whether moving (e.g., videos) or stationary (e.g., still images). For example, the display apparatus 1000 may be any product or component with a display function, such as a television, a notebook computer, a tablet computer, a mobile phone, a personal digital assistant (PDA), a navigator, a wearable device, a virtual reality (VR) device.

Here, the display apparatus 1000 is an electroluminescent display apparatus or a photoluminescent display apparatus. In a case where the display apparatus 1000 is the electroluminescent display apparatus, the electroluminescent display apparatus may be an organic light-emitting diode (OLED) display apparatus or a quantum dot light-emitting diode (QLED) display apparatus. In a case where the display apparatus 1000 is the photoluminescent display apparatus, the photoluminescent display apparatus may be a quantum dot photoluminescent display apparatus.

Figure 2:
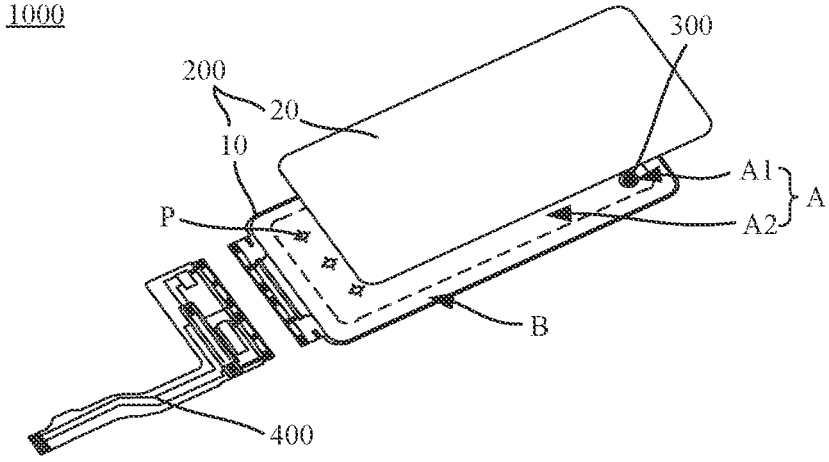
FIG. 2 is an exploded view of a display apparatus, in accordance with some embodiments.

In some embodiments, referring to FIGS. 1 and 2, the display apparatus 1000 includes a housing 100, and a display panel 200, a functional device 300, a circuit board 400 and other electronic accessories that are all disposed in the housing 100. The functional device 300 may be a camera, an infrared sensor, a proximity sensor, an eyeball tracking module, or a face recognition module. For example, as shown in FIGS. 1 and 2, the functional device 300 is the camera.

It will be noted that the display panel 200 may be an organic light-emitting diode (OLED) display panel or a quantum dot light-emitting diode (QLED) display panel, which is not specifically limited in the present disclosure.

Some embodiments of the present disclosure will be schematic described below in an example where the display panel 200 is the OLED display panel.

Figure 3:
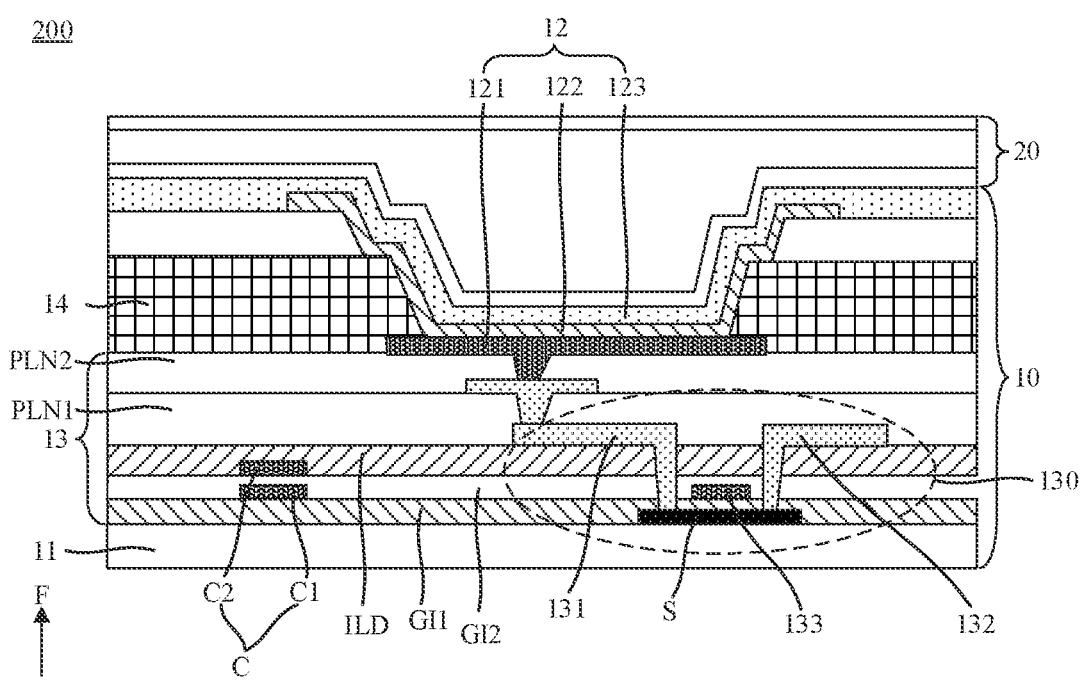
FIG. 3 is a sectional view of a display panel, in accordance with some embodiments.

In some embodiments, as shown in FIGS. 2 and 3, the display panel 200 includes a display substrate 10 and an encapsulation layer 20 for encapsulating the display substrate 10. The display substrate 10 has a light exit side and a non-light exit side arranged opposite to each other, and the encapsulation layer 20 is disposed on the light exit side of the display substrate 10.

Here, the encapsulation layer 20 may be an encapsulation film or an encapsulation substrate.

Referring to FIG. 2, the display substrate 10 has a display region A and a peripheral region B disposed on at least one side of the display region A. FIG. 2 exemplarily illustrates that the peripheral region B is arranged around the display region A.

The display region A is a region that displays image(s), and is configured to provide a plurality of pixels P. The peripheral region B is a region that does not display an image, and is configured to provide display driving circuits such as a gate driving circuit and a source driving circuit.

It will be noted that in a case where the functional device 300 is integrated below the display panel 200, the display region A has a functional device setting region A1 and a main display region A2 at least partially surrounding the functional device setting region A1. The functional device 300 is located in the functional device setting region A1.

FIGS. 1 and 2 exemplarily illustrate that the main display region A2 surrounds the functional device setting region A1.

Figure 6A:
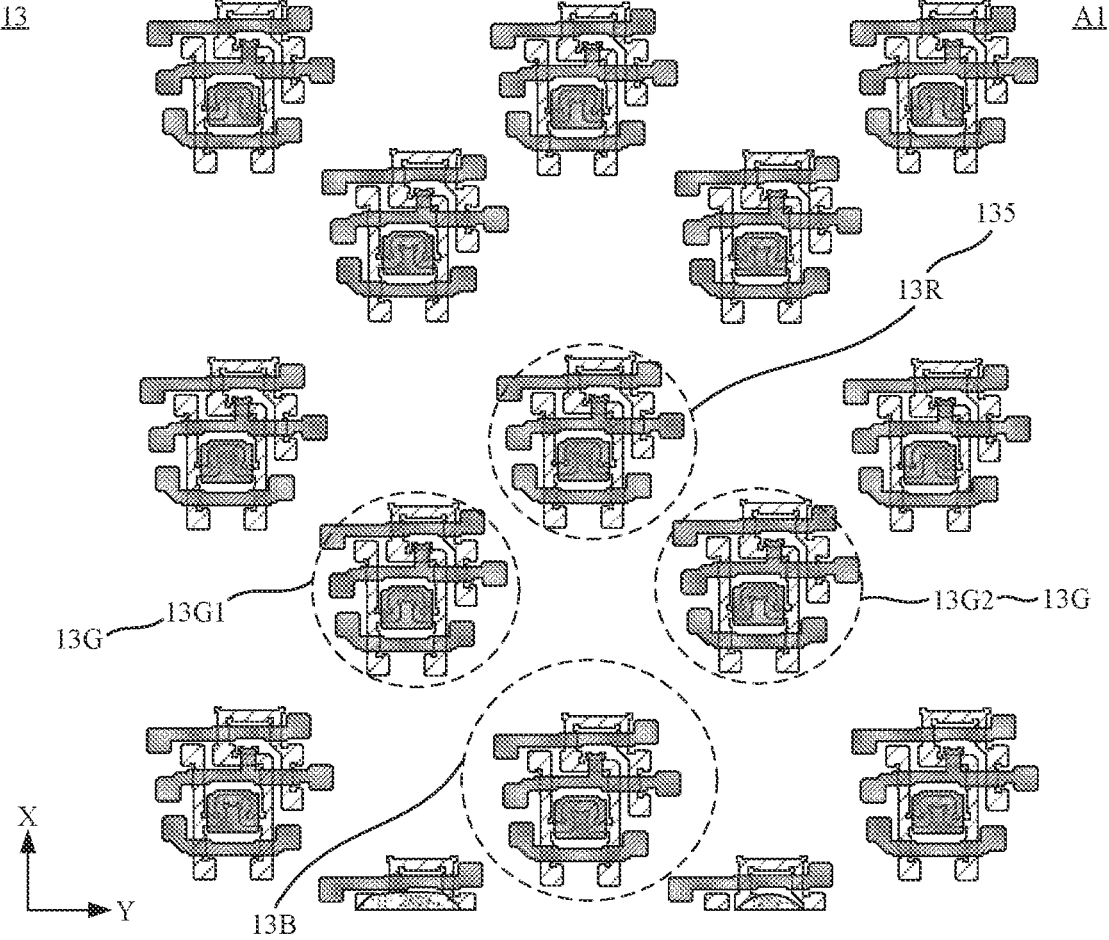
FIG. 6A is a top view showing an arrangement of pixel circuits in a functional device setting region of a display substrate, in accordance with some embodiments.
Figure 6B:
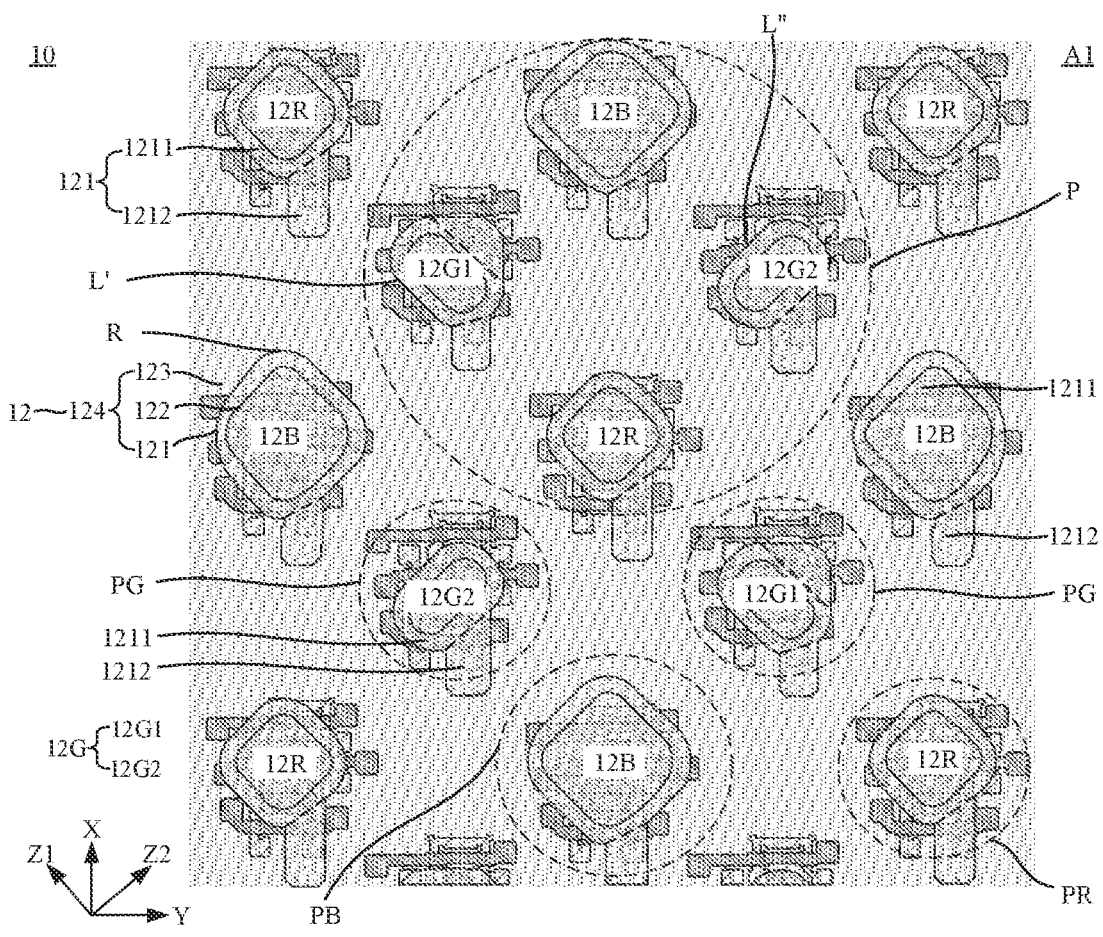
FIG. 6B is a top view showing an arrangement of sub-pixels in a functional device setting region of a display substrate, in accordance with some embodiments.
Figure 7A:
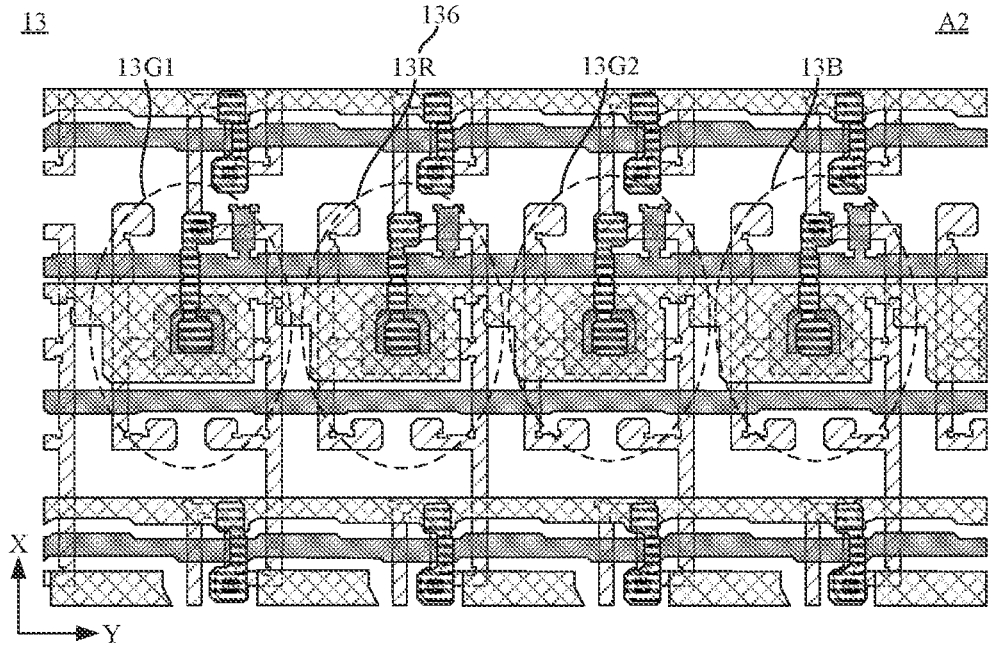
FIG. 7A is a top view showing an arrangement of pixel circuits in a main display region of a display substrate, in accordance with some embodiments.
Figure 7B:
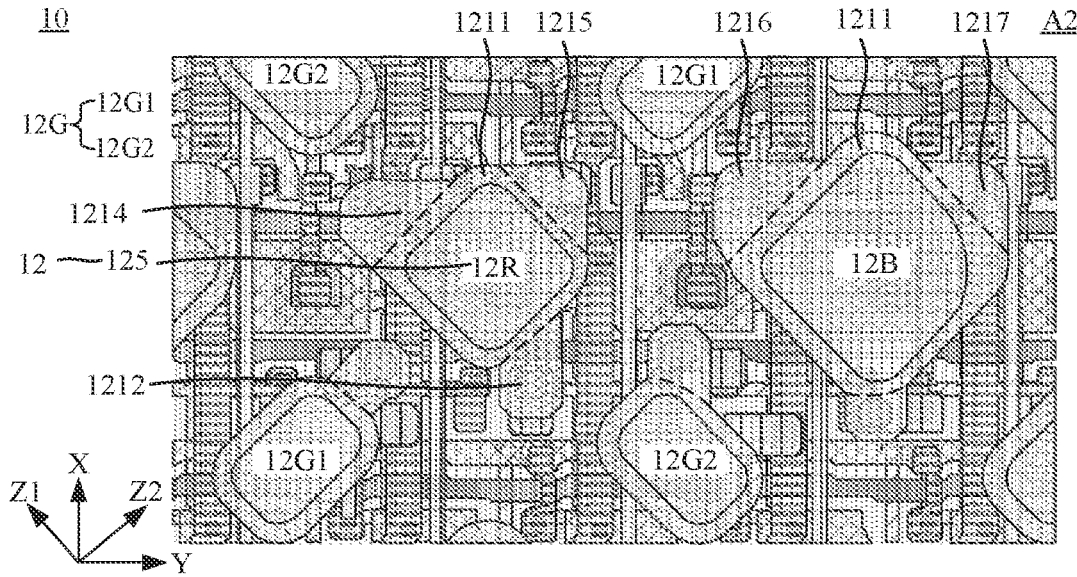
FIG. 7B is a top view showing an arrangement of sub-pixels in a main display region of a display substrate, in accordance with some embodiments.

For example, referring to FIGS. 2, 6B and 7B, in the display substrate 10, the plurality of pixels P are disposed in the display region A, and each pixel P includes sub-pixels with a plurality of light-emitting colors. The sub-pixels with the plurality of light-emitting colors include at least a first sub-pixel with a light-emitting color of a first color, a second sub-pixel with a light-emitting color of a second color, and a third sub-pixel with a light-emitting color of a third color. The first color, the second color and the third color are three primary colors, respectively. For example, the sub-pixels with the plurality of light-emitting colors include at least a first color sub-pixel PG, a second color sub-pixel PR and a third color sub-pixel PB.

It will be noted that the first color sub-pixel PG, the second color sub-pixel PR and the third color sub-pixel PB are sub-pixels with different light-emitting colors. For example, the first color sub-pixel PG is a green sub-pixel PG, the second color sub-pixel PR is a red sub-pixel PR, and the third color sub-pixel PB is a blue sub-pixel PB.

Embodiments of the present disclosure will be exemplarily described below in an example where the first color sub-pixel PG is the green sub-pixel PG, the second color sub-pixel PR is the red sub-pixel PR, and the third color sub-pixel PB is the blue sub-pixel PB.

Referring to FIG. 3, the display substrate 10 includes a substrate 11, and light-emitting devices 12 and pixel driving circuits 13 that are all disposed on the substrate 11, and each sub-pixel includes a light-emitting device 12 and a pixel driving circuit 13. The pixel driving circuit 13 includes a plurality of transistors 130. The transistor 130 includes a channel region S, a source 131, a drain 132 and a gate 133, and the source 131 and the drain 132 are in contact with the channel region S. In a direction F perpendicular to the substrate 11 and away from the substrate 11, the light-emitting device 12 includes a first electrode 121, a light-emitting functional layer 122 and a second electrode 123.

It will be noted that for the convenience of description, a pixel circuit 13 mentioned below refers to the above pixel driving circuit 13.

Here, the first electrode 121 is an anode of the light-emitting device 12, and the second electrode 123 is a cathode of the light-emitting device 12. Alternatively, the first electrode 121 is a cathode of the light-emitting device 12, and the second electrode 123 is an anode of the light-emitting device 12.

For example, as shown in FIG. 3, the first electrode 121 is the anode of the light-emitting device 12, and the second electrode 123 is the cathode of the light-emitting device 12. The first electrode 121 is electrically connected to a source 131 or a drain 132 of a transistor 130 in a pixel circuit 13.

FIG. 3 exemplarily illustrates that the first electrode 121 is electrically connected to the source 131 of the transistor 130 in the pixel circuit 13.

In some embodiments, the light-emitting functional layer 122 includes only a light-emitting layer. In some other embodiments, in addition to the light-emitting layer, the light-emitting functional layer 122 further includes at least one of an electron transport layer (ETL), an electron injection layer (EIL), a hole transport layer (HTL) and a hole injection layer (HIL).

A structure of the pixel circuit 13 varies, and may be set according to actual needs. For example, the pixel circuit 13 may have a structure such as "2T1C," "3T1C," "6T1C," "7T1C," "6T2C" or "7T2C". Here, "T" represents a transistor, a number before "T" represents the number of transistors, "C" represents a storage capacitor, and a number before "C" represents the number of storage capacitors.

Here, during the use of the display panel 200, stabilities of the transistors in the pixel circuit 13 and the light-emitting device 12 may be decreased (for example, a threshold voltage of a driving transistor is shifted), which affects a display effect of the display panel 200, so that it is necessary to compensate for the pixel circuit 13.

There are various methods to compensate for the pixel circuit 13, which may be set according to actual needs. For example, a pixel compensation circuit may be provided in the pixel circuit 13, so that the pixel compensation circuit is used to perform an internal compensation for the pixel circuit 13. For another example, the driving transistor or the light-emitting device 22 may be sensed through a transistor in the pixel circuit 13, and sensed data is transmitted to an external sensing circuit, so as to use the external sensing circuit to calculate a driving voltage value that needs to be compensated and give feedback, thereby achieving an external compensation for the pixel circuit 13.

A structure and an operating process of the pixel circuit 13 will be schematically illustrated in the present disclosure in an example where the external compensation is used, and the pixel circuit 13 has a 7T1C structure.

Figure 4:
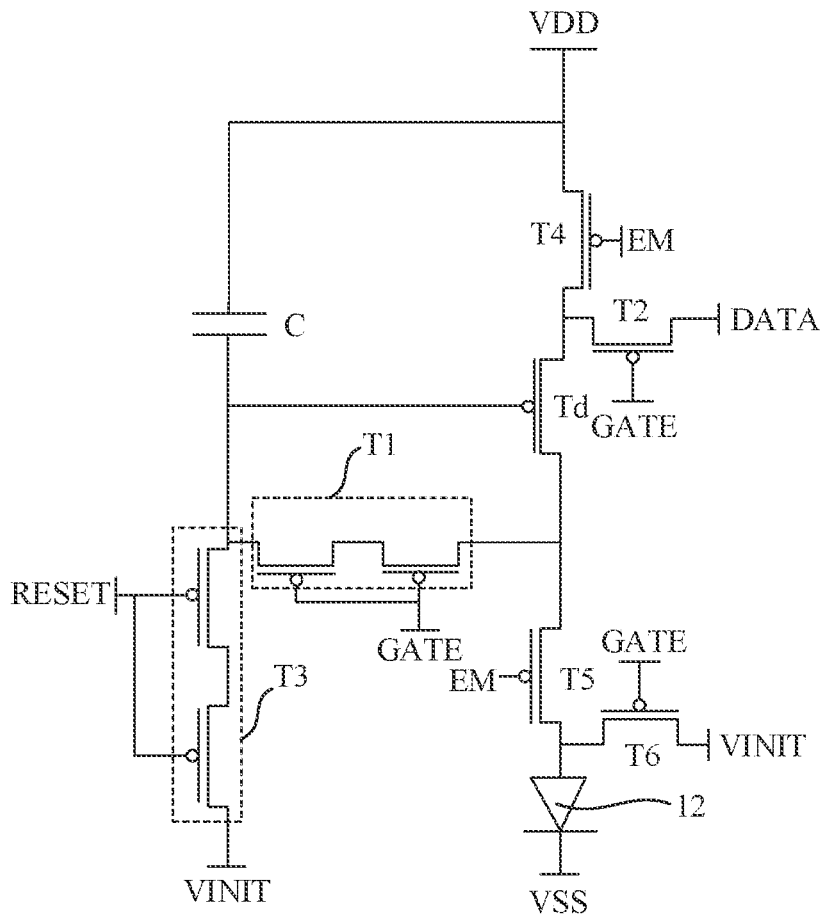
FIG. 4 is a schematic circuit diagram of a pixel driving circuit, in accordance with some embodiments.

For example, as shown in FIG. 4, the pixel circuit 13 may include a first transistor T1, a second transistor T2, a third transistor T3, a fourth transistor T4, a fifth transistor T5, a sixth transistor T6, the driving transistor Td and a storage capacitor C.

A control electrode of the first transistor T1 is electrically connected to a scan signal terminal GATE, a first electrode of the first transistor T1 is electrically connected to a second electrode of the driving transistor Td, and a second electrode of the first transistor T1 is electrically connected to a control electrode of the driving transistor Td.

A control electrode of the second transistor T2 is electrically connected to the scan signal terminal GATE, a first electrode of the second transistor T2 is electrically connected to a data signal terminal DATA, and a second electrode of the second transistor T2 is electrically connected to a first electrode of the driving transistor Td.

A control electrode of the third transistor T3 is electrically connected to a reset signal terminal RESET, a first electrode of the third transistor T3 is electrically connected to an initialization signal terminal VINIT, and a second electrode of the third transistor T3 is electrically connected to the control electrode of the driving transistor Td.

A control electrode of the fourth transistor T4 is electrically connected to an enable signal terminal EM, a first electrode of the fourth transistor T4 is electrically connected to a first voltage signal terminal VDD, and a second electrode of the fourth transistor T4 is electrically connected to the first electrode of the driving transistor Td.

A control electrode of the fifth transistor T5 is electrically connected to the enable signal terminal EM, a first electrode of the fifth transistor T5 is electrically connected to the second electrode of the driving transistor Td, and a second electrode of the fifth transistor T5 is electrically connected to the first electrode 121 of the light-emitting device 12 (see FIG. 3).

A control electrode of the sixth transistor T6 is electrically connected to the scan signal terminal GATE, a first electrode of the sixth transistor T6 is electrically connected to the initialization signal terminal VINIT, and a second electrode of the sixth transistor T6 is electrically connected to the first electrode 121 of the light-emitting device 12 (see FIG. 3).

A first electrode plate C1 (see FIG. 3) of the storage capacitor C is electrically connected to the control electrode of the driving transistor Td, and a second electrode plate C2 (see FIG. 3) of the storage capacitor C is electrically connected to the first voltage signal terminal VDD.

Figure 5:
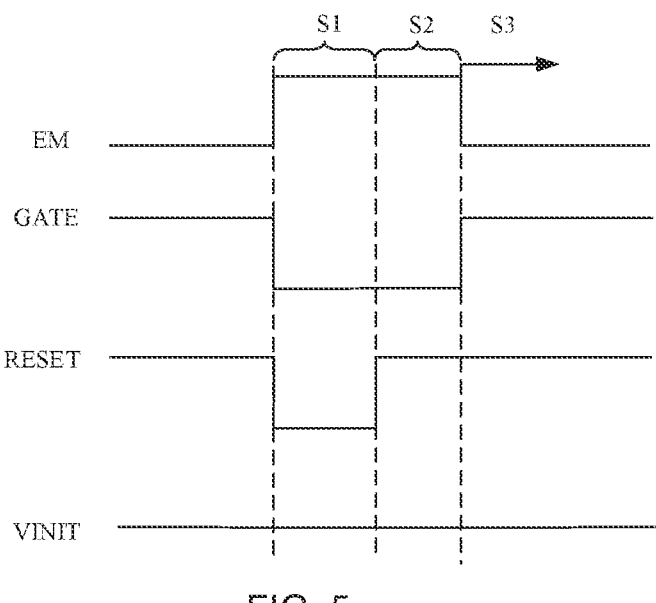
FIG. 5 is a timing diagram of a pixel driving circuit, in accordance with some embodiments.

Based on the structure of the pixel circuit 13, as shown in FIGS. 4 and 5, in a frame of display phase, an operating process of a sub-pixel may include, for example, a reset phase S1, a data writing phase S2 and a light-emitting phase S3.

In the reset phase S1, the sixth transistor T6 is turned on under a control of a scan signal Gate from the scan signal terminal GATE, so that a voltage of the first electrode of the light-emitting device 12 is reset to an initialization signal Vinit; and the third transistor T3 is turned on under a control of a reset signal Reset from the reset signal terminal RESET, so that a voltage of the control electrode of the driving transistor Td and a voltage of the first electrode plate C1 of the storage capacitor C are reset to the initialization signal Vinit.

In the data writing phase S2, the first transistor T1 and the second transistor T2 are turned on under the control of the scan signal Gate from the scan signal terminal GATE, and the driving transistor Td is turned on under a control of the initialization signal stored in the storage capacitor C, so that a data signal Data from the data signal terminal DATA is written into the storage capacitor C.

In the light-emitting phase S3, the fourth transistor T4 and the fifth transistor T5 are turned on under a control of an enable signal Em of the enable signal terminal EM to output a driving current signal to the light-emitting device 12, so as to drive the light-emitting device 12 to emit light.

In some embodiments, as shown in FIG. 3, the display substrate 10 further includes a pixel defining layer 14 disposed on a side of the first electrode 121 away from the substrate 11. The pixel defining layer 14 includes a plurality of opening regions, and a light-emitting device 12 is disposed in an opening region. That is, the light-emitting functional layer 122 of the light-emitting device 12 is in electrical contact with the first electrode 121 in the opening region.

It will be noted that, in order to reduce the process difficulty, an area of the first electrode 121 is greater than an area of the opening region of the pixel defining layer 14, so as to ensure that the entire opening region of the pixel defining layer 14 is an effective light-emitting region of the light-emitting device 12. That is, a portion of the first electrode 121, a portion of the second electrode 123 and a portion of the light-emitting functional layer 122 that are overlapped constitutes the effective light-emitting region of the light-emitting device 12. That is, a portion of the first electrode 121, a portion of the second electrode 123 and a portion of the light-emitting functional layer 122 each corresponding to a region where the opening region of the pixel defining layer 14 is located constitutes the effective light-emitting region of the light-emitting device 12.

FIG. 6A is a top view showing an arrangement of pixel circuits in the functional device setting region of the display substrate, in accordance with some embodiments.

FIG. 6B is a top view showing an arrangement of sub-pixels in the functional device setting region of the display substrate, in accordance with some embodiments. Referring to FIGS. 6A and 6B, a pixel P includes a second color sub-pixel PR, a first color sub-pixel PG and a third color sub-pixel PB.

A schematic description will be made below in an example where the pixel P includes the second color sub-pixel PR, the first color sub-pixel PG and the third color sub-pixel PB.

Human eyes have different sensitivities to red, green and blue light. That is, the human eyes are more sensitive to green light than to red light, and are more sensitive to red light than to blue light.

Based on this, an area of an opening region corresponding to the third color sub-pixel PB is greater than an area of an opening region corresponding to the second color sub-pixel PR, and the area of the opening region corresponding to the second color sub-pixel PR is greater than an area of an opening region corresponding to the first color sub-pixel PG. In this case, an area of a first electrode 121 of a third color light-emitting device 12B is greater than an area of a first electrode 121 of a second color light-emitting device 12R, and the area of the first electrode 121 of the second color light-emitting device 12R is greater than an area of a first electrode 121 of a first color light-emitting device 12G.

It will be noted that herein, the second color light-emitting device 12R refers to a light-emitting device 12 in the second color sub-pixel PR, the first color light-emitting device 12G refers to a light-emitting device 12 in the first color sub-pixel PG, and the third color light-emitting device 12B refers to a light-emitting device 12 in the third color sub-pixel PB.

It can be understood that referring to FIGS. 2, 3 and 4, a light-shielding layer disposed on a display side of the display panel 200 reduces a light transmittance of the display panel 200. Therefore, in some related arts, in a functional device setting region of a display panel, a light-shielding layer is not separately designed to shield transistors of a pixel circuit, so as to avoid an influence on light sensing of a functional device. In this way, in the functional device setting region, since an area of a first electrode of a first color light-emitting device is small, a first transistor in a first color pixel circuit is not shielded by the first electrode of the first color light-emitting device, so that a threshold voltage of the first transistor is shifted under illumination, and thus a written data signal is shifted, thereby affecting a display effect.

It will be noted that herein, as shown in FIGS. 6A and 6B, a second color pixel circuit 13R refers to a pixel circuit 13 in the second color sub-pixel PR, a first color pixel circuit 13G refers to a pixel circuit 13 in the first color sub-pixel, and a third color pixel circuit 13B refers to a pixel circuit 13 in the third color sub-pixel PB.

Based on this, in the display substrate 10 provided in some embodiments of the present disclosure, as shown in FIGS. 1 and 2, the display region A of the display substrate 10 includes the functional device setting region A1 and the main display region A2 at least partially surrounding the functional device setting region A1. Here, a light transmittance of the functional device setting region A1 is greater than a light transmittance of the main display region A2.

Referring to FIGS. 2, 6A and 7A, the pixel circuits 13 include first pixel circuits 135 located in the functional device setting region A1 and second pixel circuits 136 located in the main display region A2. Referring to FIGS. 2, 6B and 7B, the light-emitting devices 12 include first light-emitting devices 124 located in the functional device setting region A1 and second light-emitting devices 125 located in the main display region A2.

The first pixel circuits 135 and the first light-emitting devices 124 located in the functional device setting region A1, and the second pixel circuits 136 and the second light-emitting devices 125 located in the main display region A2 will be described below.

Figure 8:
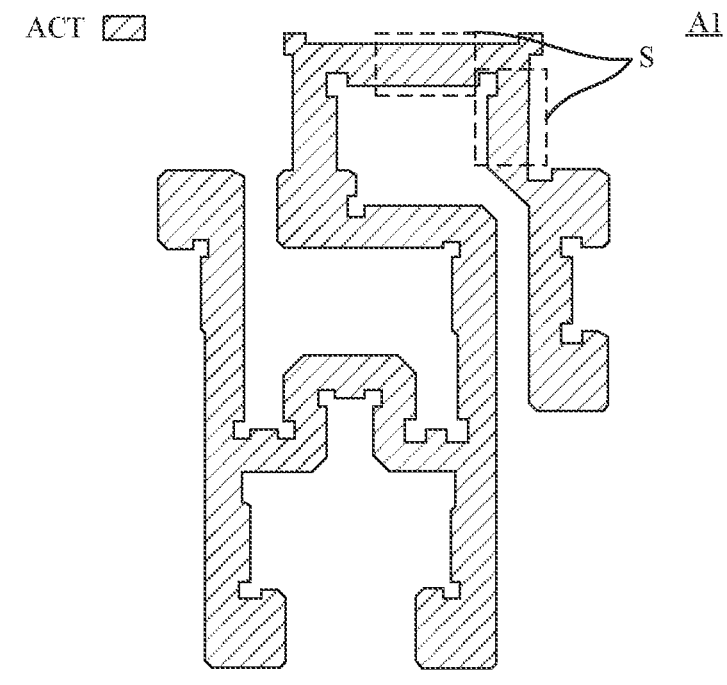
FIG. 8 is a top view of a semiconductor layer in a functional device setting region of a display substrate, in accordance with some embodiments.

In the functional device setting region A1, referring to FIGS. 6A, 6B, 8 and 14, an orthographic projection of a channel region S of a first transistor T1 in the first color pixel circuit 13G on the substrate 11 (see FIG. 3) is at least partially overlapped with an orthographic projection of a first electrode 121 of the first color light-emitting device 12G on the substrate 11 (see FIG. 3). For example, the orthographic projection of the channel region S of the first transistor T1 in the first color pixel circuit 13G on the substrate 11 (see FIG. 3) is located within the orthographic projection of the first electrode 121 of the first color light-emitting device 12G on the substrate 11 (see FIG. 3). FIG. 8 illustrates only the channel region S of the first transistor T1.

In this case, the channel region S of the first transistor T1 in the first color pixel circuit 13G may be shielded by the first electrode 121 of the first color light-emitting device 12G, so that external ambient light is prevented from directly reaching the channel region S of the first transistor T1 in the first color pixel circuit 13G, and thus a risk of a threshold voltage shift of the first transistor T1 is reduced to improve an accuracy of a data signal Data written into the first color pixel circuit 13G, thereby improving the display effect of the display panel 200.

Moreover, in the functional device setting region A1, referring to FIGS. 6A, 6B and 8, an orthographic projection of a channel region S of a first transistor T1 in the second color pixel circuit 13R on the substrate 11 is located within an orthographic projection of a first electrode 121 of the second color light-emitting device 12R on the substrate 11; and an orthographic projection of a channel region S of a first transistor T1 in the third color pixel circuit 13B on the substrate 11 is located within an orthographic projection of a first electrode 121 of the third color light-emitting device 12B on the substrate 11.

In this way, the channel region S of the first transistor T1 in the second color pixel circuit 13R may be shielded by the first electrode 121 of the second color light-emitting device 12R, and the channel region S of the first transistor T1 in the third color pixel circuit 13B may be shielded by the first electrode 121 of the third color light-emitting device 12B, so that the external ambient light is prevented from directly reaching the channel regions S of the first transistors T1 in the second color pixel circuit 13R and the third color pixel circuit 13B, and thus a risk of a threshold voltage shift of each of the first transistors T1 is reduced to improve an accuracy of a data signal Data written into each of the second color pixel circuit 13R and the third color pixel circuit 13B, thereby improving the display effect of the display panel 200.

It can be seen from the above that, in the functional device setting region A1, a channel region S of a first transistor T1 in the first pixel circuit 135 may be shielded by a first electrode 121 of a first light-emitting device 124 electrically connected to the first pixel circuit 135, so that an accuracy of a data signal Data written into the first pixel circuit 135 in the functional device setting region A1 may be improved, thereby improving a display effect of the functional device setting region A1 of the display panel 200.

Figure 15:
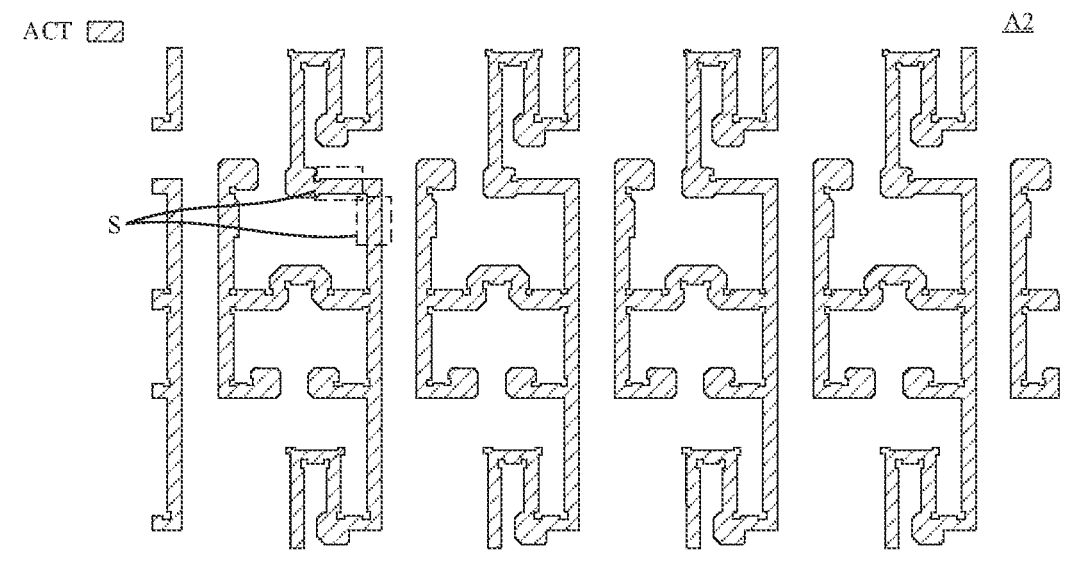
FIG. 15 is a top view of a semiconductor layer in a main display region of a display substrate, in accordance with some embodiments.

In the main display region A2, referring to FIGS. 7A, 7B and 15, orthographic projections of channel regions S of first transistors T1 in second pixel circuits 136 on the substrate 11 (see FIG. 3) are respectively located within orthographic projections of first electrodes 121 of second light-emitting devices 125 on the substrate 11 (see FIG. 3). FIG. 15 illustrates only the channel region S of the first transistor T1.

It can be seen from the above that, in the main display region A2, the channel region S of the first transistor T1 in the second pixel circuit 136 may be shielded by the first electrode 121 of the second light-emitting device 125, so that the main display region A2 may not be provided with a light-shielding layer, which simplifies the process, and increases the light transmittance of the main display region A2 of the display panel 200, thereby improving a display effect of the main display region A2 of the display panel 200.

In some embodiments, as shown in FIGS. 6B and 7B, the first color light-emitting devices 12G include first color sub-light-emitting devices 12G1 and second color sub-light-emitting devices 12G2. On this basis, each pixel P includes a second color light-emitting device 12R, a first color sub-light-emitting device 12G1, a second color sub-light-emitting device 12G2 and a third color light-emitting device 12B. This arrangement manner may improve the display effect of the display panel 200 (see FIG. 2).

It can be understood that, in order to improve the light transmittance of the functional device setting region A1 of the display panel 200, the first pixel circuits 135 in the functional device setting region A1 are designed to be compact. That is, compared with the second pixel circuits 136 in the main display region A2, an entirety of the first pixel circuits 135 occupies a smaller area to improve the light transmittance of the functional device setting region A1 of the display panel 200, which is conducive to lighting of the functional device 300.

For example, in the functional device setting region A1, as shown in FIG. 6A, the first pixel circuits 135 are arranged in a plurality of rows each including first pixel circuits 135 arranged in a second direction Y. In a first direction X, first pixel circuits 135 in a row are staggered from first pixel circuits 135 in an adjacent row. The first direction X is approximately perpendicular to the second direction Y.

For example, in the main display region A2, as shown in FIG. 7A, the second pixel circuits 136 are arranged in a plurality of rows each including second pixel circuits 136 arranged in the second direction Y. In the first direction X, second pixel circuits 136 in a row are aligned with second pixel circuits 136 in an adjacent row. The first direction X is approximately perpendicular to the second direction Y.

On this basis, as shown in FIGS. 6B and 7B, the second color light-emitting devices 12R and the first color sub-light-emitting devices 12G1 may be alternately arranged in a first oblique direction Z1, and the third color light-emitting devices 12B and the second color sub-light-emitting devices 12G2 are alternately arranged in the first oblique direction Z1. Moreover, the second color light-emitting devices 12R and the third color light-emitting devices 12B are alternately arranged in the first direction X, and the first color sub-lightemitting devices 12G1 and the second color sub-light-emitting devices 12G2 are alternately arranged in the first direction X.

The first oblique direction Z1 intersects with the first direction X and the second direction Y. For example, an included angle between the first oblique direction Z1 and the first direction X is substantially in a range of 130° to 140°, inclusive, and an included angle between the first oblique direction Z1 and the second direction Y is substantially in a range of 40° to 50°, inclusive.

In addition, referring to FIGS. 6B, 7B, 14 and 21, the first electrodes 121 of the second color light-emitting device 12R, the first color light-emitting device 12G and the third color light-emitting device 12B each include a body portion 1211 and a connection portion 1212.

An orthographic projection of the effective light-emitting region on the substrate 11 is located within an orthographic projection of the body portion 1211 on the substrate 11. The body portion 1211 has a similar shape to a corresponding opening region of the pixel defining layer 14 (see FIG. 3), and is in contact with the light-emitting function layer 122 in the opening region. The connection portion 1212 is substantially in a shape of a long strip, and has an end connected to the body portion 1211 and another end connected to a pad M (see FIGS. 13 and 20) of a corresponding first pixel circuit 135.

It will be noted that the phrase "substantially in a shape of a long strip" herein refers to a shape of a rectangle on the whole, but is not limited to a standard shape of a rectangle. That is, the "the shape of the long strip" here includes not only a basic shape of a rectangle, but also shape(s) similar to the rectangle in consideration of process conditions. For example, corner(s) of the rectangle are curved, i.e., are smooth.

In some embodiments, referring to FIGS. 6B and 7B, the body portions 1211 of the first electrodes 121 of the second color light-emitting device 12R and the third color light-emitting device 12B are substantially in a shape of a rhombus, and the body portion 1211 of the first electrode 121 of the first color light-emitting device 12G is substantially in a shape of a long strip.

It will be noted that "substantially in a shape of a rhombus" herein refers to a shape of a rhombus on the whole, but is not limited to a standard shape of a rhombus. That is, "a shape of a rhombus" here includes not only a basic shape of a rhombus, but also shape(s) similar to the rhombus in consideration of process conditions. For example, corners of the rhombus are curved, i.e., are smooth.

It can be understood that since the first pixel circuits 135 in the functional device setting region A1 are designed to be compact, the shielding of the channel region S of the first transistor T1 in the pixel circuit 13 in the functional device setting region A1 and the main display region A2 may be designed differently according to a relative positional relationship of the light-emitting device 12 and the pixel circuit 13.

In the functional device setting region A1, referring to FIGS. 6A and 6B, for the second color light-emitting device 12R and the third color light-emitting device 12B, the body portions 1211 of the first electrodes 121 of the second color light-emitting device 12R and the third color light-emitting device 12B are substantially in the shape of the rhombus, and two diagonal lines of the rhombus are approximately parallel to the first direction X and the second direction Y, respectively.

In this case, the areas of the opening regions respectively at the first electrodes 121 of the second color light-emitting device 12R and the third color light-emitting device 12B are large. That is, areas of the body portions 1211 of the first electrodes 121 of the second color light-emitting device 12R and the third color light-emitting device 12B are large. Therefore, the orthographic projection of the channel region S of the first transistor T1 in the second color pixel circuit 13R on the substrate 11 may be located within an orthographic projection of the body portion 1211 of the first electrode 121 of the second color light-emitting device 12R on the substrate 11; the orthographic projection of the channel region S of the first transistor T1 in the third color pixel circuit 13B on the substrate 11 may be located within an orthographic projection of the body portion 1211 of the first electrode 121 of the third color light-emitting device 12B on the substrate 11.

In the functional device setting region A1, as shown in FIGS. 6B and 8, for the body portion 1211 of the first electrode 121 of the first color light-emitting device 12G, the area of the opening region at the first electrode 121 of the first color light-emitting device 12G is small. That is, an area of the body portion 1211 of the first electrode 121 of the first color light-emitting device 12G is small, and the body portion 1211 of the first electrode 121 of the first color light-emitting device 12G is substantially in a shape of a long strip. In this way, whether the orthographic projection of the channel region S of the first transistor T1 in the first color pixel circuit 13G on the substrate 11 (see FIG. 3) may be located within the orthographic projection of the body portion 1211 of the first electrode 121 of the first color light-emitting device 12G on the substrate 11 (see FIG. 3) needs to be determined according to an arrangement direction of a long side of the body portion 1211 of the first electrode 121 of the first color light-emitting device 12G.

For example, as shown in FIG. 6B, a plurality of first color light-emitting devices 12G include first color sub-light-emitting devices 12G1 and second color sub-light-emitting devices 12G2. The first color sub-light-emitting device 12G1 has a long side L" in the first oblique direction Z1, and the second color sub-light-emitting device 12G2 has a long side L" in a second oblique direction Z2.

It will be noted that the second oblique direction Z2 intersects with the first oblique direction Z1, the first direction X and the second direction Y. For example, the second oblique direction Z2 is approximately perpendicular to the first oblique direction Z1.

Moreover, an included angle between the second oblique direction Z2 and the first direction X is an acute angle, and is substantially in a range of 40° to 50°, inclusive; and an included angle between the second oblique direction Z2 and the second direction Y is an acute angle, and is substantially in a range of 40° to 50°, inclusive.

One of the first color sub-light-emitting device 12G1 and the second color sub-light-emitting device 12G2 is a set light-emitting device, and another one of the first color sub-light-emitting device 12G1 and the second color sub-light-emitting device 12G2 is a non-set light-emitting device. FIG. 6B exemplarily illustrates that the first color sub-light-emitting device 12G1 is the set light-emitting device, and the second color sub-light-emitting device 12G2 is the non-set light-emitting device.

Referring to FIGS. 6A, 6B and 8, an orthographic projection, on the substrate 11 (see FIG. 3), of a channel region S of a first transistor T1 in a first color pixel circuit 13G electrically connected to the non-set light-emitting device (i.e., the second color sub-light-emitting device 12G2) is located within an orthographic projection, on the substrate 11 (see FIG. 3), of a body portion 1211 of a first electrode 121 of the non-set light-emitting device (i.e., the second color sub-light-emitting device 12G2).

Figure 14:
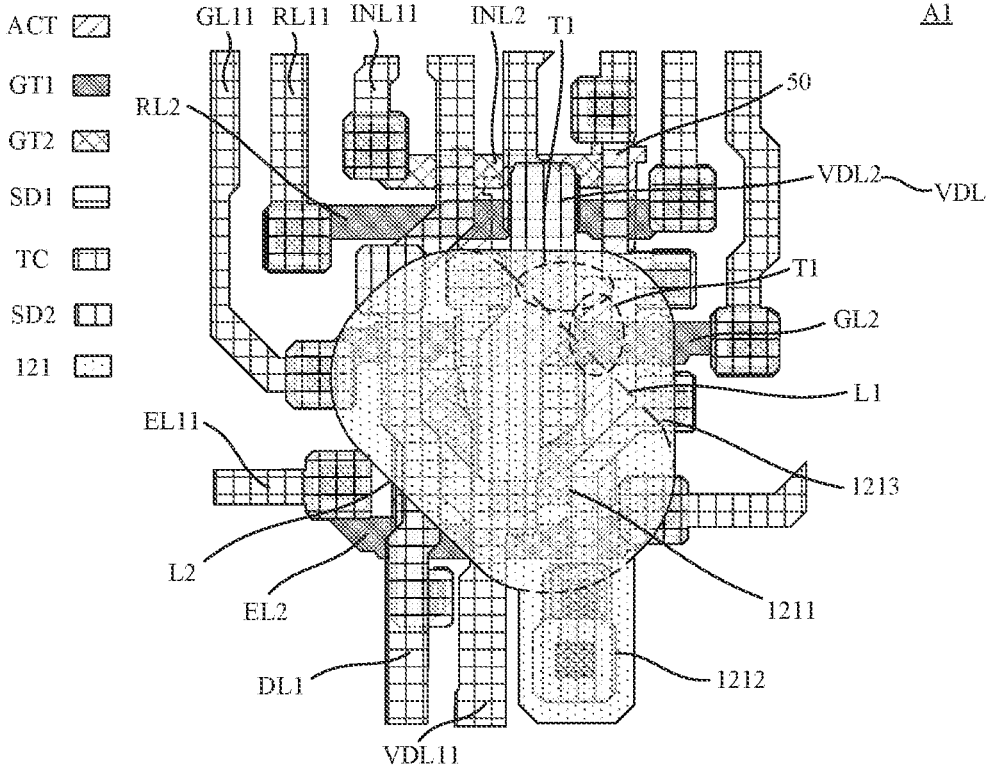
FIG. 14 is a top view of the second source-drain conductive layer with first electrodes added thereon in the functional device setting region shown in FIG. 13.

As shown in FIGS. 3, 6B and 14, a first electrode 121 of the set light-emitting device (i.e., the first color sub-light-emitting device 12G1) further includes a first light-shielding portion 1213. An orthographic projection, on the substrate 11 (see FIG. 3), of a channel region S of a first transistor T1 in a first color pixel circuit 13G electrically connected to the set light-emitting device is located within an orthographic projection of the first light-shielding portion 1213 on the substrate 11 (see FIG. 3).

For example, as shown in FIGS. 6A, 6B, 9 and 14, the body portion 1211 includes a first long side L1 and a second long side L2 (i.e., L') arranged opposite to each other. In the first color pixel circuit 13G electrically connected to the set light-emitting device (i.e., the first color sub-light-emitting device 12G1), the orthographic projection of the channel region of the first transistor T1 on the substrate 11 is located on a side of an orthographic projection of the first long side L1 of the body portion 1211 on the substrate 11 away from an orthographic projection of the second long side L2 on the substrate 11.

In this case, in the first electrode 121 of the set light-emitting device (i.e., the first color sub-light-emitting device 12G1), the first light-shielding portion 1213 is located on a side of the first long side L1 of the body portion 1211 away from the second long side L2, and is connected to the first long side L1 of the body portion 1211.

In this way, the first electrode 121 of the set light-emitting device (i.e., the first color sub-light-emitting device 12G1) has a small deformation, so that the process is simple, and a large influence on the light transmittance of the display panel 200 may be avoided.

Here, the first light-shielding portion 1213 may be in a shape of a polygon, a shape of a fan, or another irregular shape. For example, the orthographic projection of the first light-shielding portion 1213 on the substrate 11 is substantially in a shape of a triangle.

It will be noted that "substantially in a shape of a triangle" herein refers to a shape of a triangle on the whole, but is not limited to a standard shape of a triangle. That is, "the shape of the triangle" here includes not only a basic shape of a triangle, but also shape(s) similar to the triangle in consideration of process conditions. For example, corners of the triangle are curved, i.e., are smooth.

In the main display region A2, as shown in FIGS. 7A and 7B, a plurality of second pixel circuits 136 include a plurality of second pixel circuit groups. Each second pixel circuit group includes a second color pixel circuit 13R electrically connected to the second color light-emitting device 12R, a third color pixel circuit 13B electrically connected to the third color light-emitting device 12B, a first sub-pixel circuit 13G1 electrically connected to the first color sub-light-emitting device 12G1, and a second sub-pixel circuit 13G2 electrically connected to the second color sub-light-emitting device 12G2. The first sub-pixel circuit 13G1, the second color pixel circuit 13R, the second sub-pixel circuit 13G2 and the third color pixel circuit 13B are arranged in sequence in the second direction Y.

In addition, for the second color light-emitting device 12R and the third color light-emitting device 12B, the body portions 1211 of the first electrodes 121 of the second color light-emitting device 12R and the third color light-emitting device 12B each are substantially in a shape of a rhombus, and two diagonal lines of the rhombus are approximately parallel to the first direction X and the second direction Y, respectively.

Figure 16:
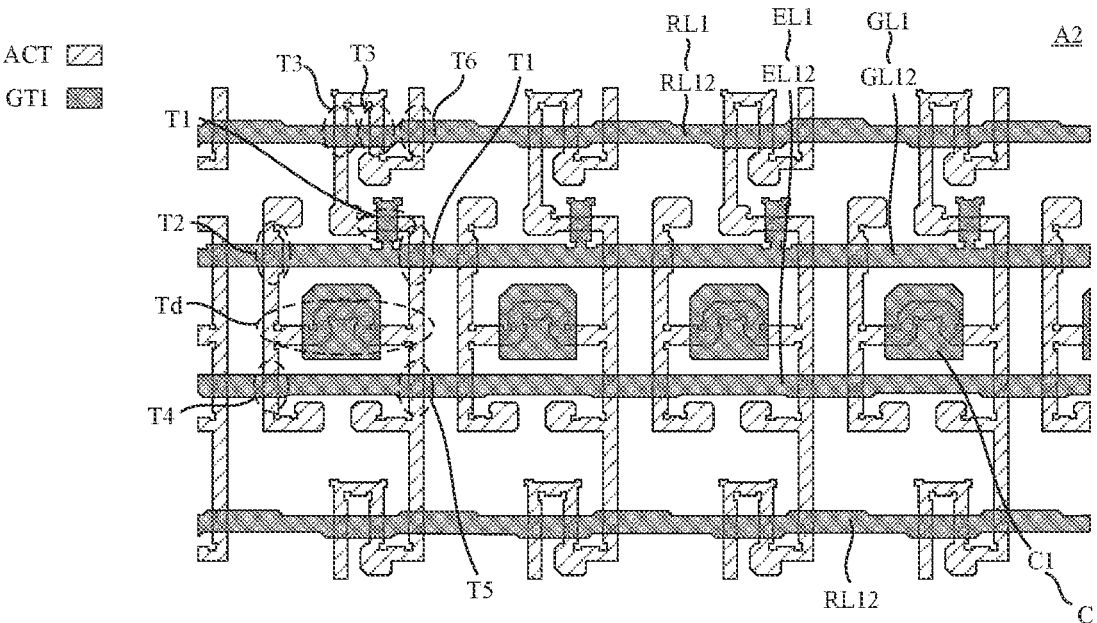
FIG. 16 is a top view of the semiconductor layer with a first gate conductive layer added thereon in the main display region shown in FIG. 15.

In this case, as shown in FIGS. 7A and 16, a first transistor T1 in the second sub-pixel circuit 13G2 and the first transistor T1 in the second color pixel circuit 13R are arranged adjacent to the second color light-emitting device 12R, and are respectively located on two sides of the second color light-emitting device 12R.

Based on this, referring to FIGS. 7A, 7B, 16 and 21, the first electrode 121 of the second color light-emitting device 12R may further include a second light-shielding portion 1214 and a third light-shielding portion 1215. An orthographic projection of a channel region S (see FIG. 3) of the first transistor T1 in the second sub-pixel circuit 13G2 on the substrate 11 (see FIG. 3) may be located within an orthographic projection of the second light-shielding portion 1214 on the substrate 11 (see FIG. 3). An orthographic projection of the channel region S (see FIG. 3) of the first transistor T in the second color pixel circuit 13R on the substrate 11 (see FIG. 3) may be located within an orthographic projection of the third light-shielding portion 1215 on the substrate 11.

For example, as shown in FIGS. 7A, 7B, 16 and 21, the body portion 1211 of the first electrode 121 of the second color light-emitting device 12R includes a first border L3, a second border L4, a third border L5 and a fourth border L6 connected in sequence. The first transistor T1 in the second color pixel circuit 13R is located on a side of the second border L4 of the body portion 1211 away from the fourth border L6. The first transistor T1 in the second sub-pixel circuit 13G2 is located on a side of the first border L3 of the body portion 1211 away from the third border L5.

In this case, the second light-shielding portion 1214 is located on the side of the first border L3 of the body portion 1211 away from the third border L5, and is connected to the first border of the body portion 1211. The third light-shielding portion 1214 is located on the side of the second border L4 of the body portion 1211 away from the fourth border L6, and is connected to the second border L4 of the body portion 1211.

In this way, the first electrode 121 of the second color sub-light-emitting device 12G2 does not need to be deformed, and the first electrode 121 of the second color light-emitting device 12R has a small deformation, so that the process is simple, and a large influence on the light transmittance of the display panel 200 may be avoided.

In this case, as shown in FIGS. 7A, 7B and 16, a first transistor T1 in the first sub-pixel circuit 13G1 and the first transistor T1 in the third color pixel circuit 13B are arranged adjacent to the third color light-emitting device 12B, and are respectively located on two sides of the body portion 1211 of the third color light-emitting device 12B.

Based on this, referring to FIGS. 7A, 7B, 15, 16 and 21, the first electrode 121 of the third color light-emitting device 12B further includes a fourth light-shielding portion 1216 and a fifth light-shielding portion 1217. An orthographic projection of a channel region S of the first transistor T1 in the first sub-pixel circuit 13G1 on the substrate 11 (see FIG. 3) may be located within an orthographic projection of the fifth light-shielding portion 1217 on the substrate 11 (see FIG. 3). The orthographic projection of the channel region S of the first transistor T1 in the third color pixel circuit 13B on the substrate 11 (see FIG. 3) is located within an orthographic projection of the fourth light-shielding portion 1216 on the substrate 11 (see FIG. 3).

For example, as shown in FIGS. 7A, 7B, 16 and 21, the body portion 1211 of the first electrode 121 of the third color light-emitting device 12B includes a first border L3, a second border L4, a third border L5 and a fourth border L6 connected in sequence. The first transistor T1 in the third color pixel circuit 13B is located on a side of the first border L3 of the body portion 1211 away from the third border L5. The first transistor T1 in the first sub-pixel circuit 13G1 is located on a side of the second border L4 of the body portion 1211 away from the fourth border L6.

In this case, the fourth light-shielding portion 1216 is located on the side of the first border L3 of the body portion 1211 away from the third border L5, and is connected to the first border L3 of the body portion 1211. The fifth light-shielding portion 1217 is located on the side of the second border L4 of the body portion 1211 away from the fourth border L6, and is connected to the second border L4 of the body portion 1211.

In this way, the first electrode 121 of the first color sub-light-emitting device 12G1 does not need to be deformed, and the first electrode 121 of the third color light-emitting device 12B has a small deformation, so that the process is simple, and a large influence on the light transmittance of the display panel 200 may be avoided.

It will be noted that orthographic projection(s) of at least one of the second light-shielding portion 1214, the third light-shielding portion 1215, the fourth light-shielding portion 1216 and the fifth light-shielding portion 1217 on the substrate 11 are substantially in a shape of a triangle, which is not specifically limited.

In summary, borders of corners R of the first electrode 121 may be arc-shaped. That is, the corners are curved, i.e., are smooth.

Figure 10:
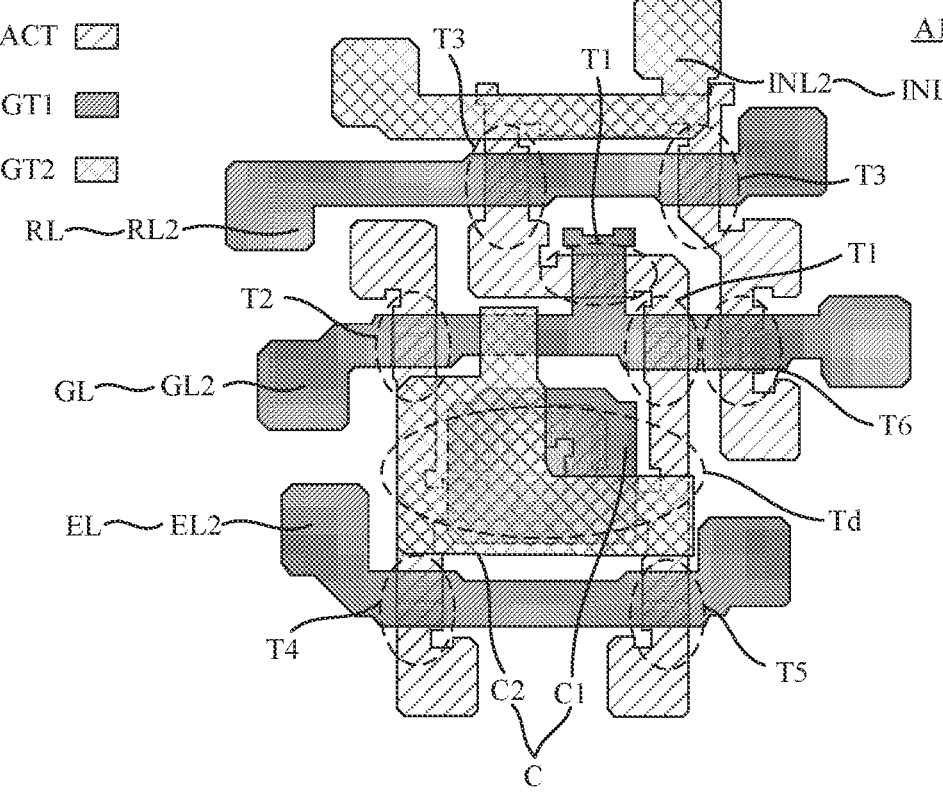
FIG. 10 is a top view of the first gate conductive layer with a second gate conductive layer added thereon in the functional device setting region shown in FIG. 9.
Figure 13:
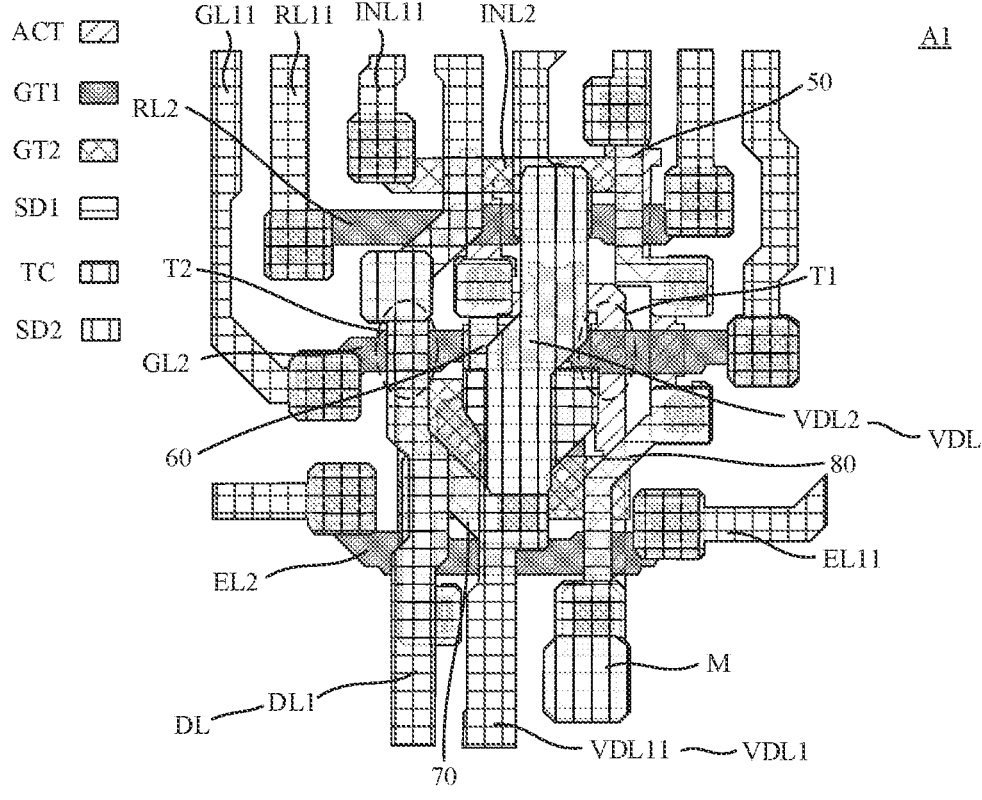
FIG. 13 is a top view of the transparent conductive layer with a second source-drain conductive layer added thereon in the functional device setting region shown in FIG. 12.

It can be understood that referring to FIGS. 3, 10 and 13, the display substrate 10 further includes scan signal lines GL, reset signal lines RL, enable signal lines EL, initialization signal lines INL, first voltage signal lines VDL and data lines DL.

The scan signal line GL is electrically connected to the scan signal terminal GATE of the pixel circuit 13, and is configured to transmit the scan signal Gate. The reset signal line RL is electrically connected to the reset signal terminal RESET of the pixel circuit 13, and is configured to transmit the reset signal Reset. The enable signal line EL is electrically connected to the enable signal terminal EM of the pixel circuit 13, and is configured to transmit the enable signal Em. The initialization signal line INL is electrically connected to the initialization signal terminal of the pixel circuit 13, and is configured to transmit the initialization signal Vinit. The first voltage signal line VDL is electrically connected to the first voltage signal terminal VDD of the pixel circuit 13, and is configured to transmit a first voltage signal Vdd. The data line DL is electrically connected to the data signal terminal DATA of the pixel circuit 13, and is configured to transmit the data signal Data.

Figure 9:
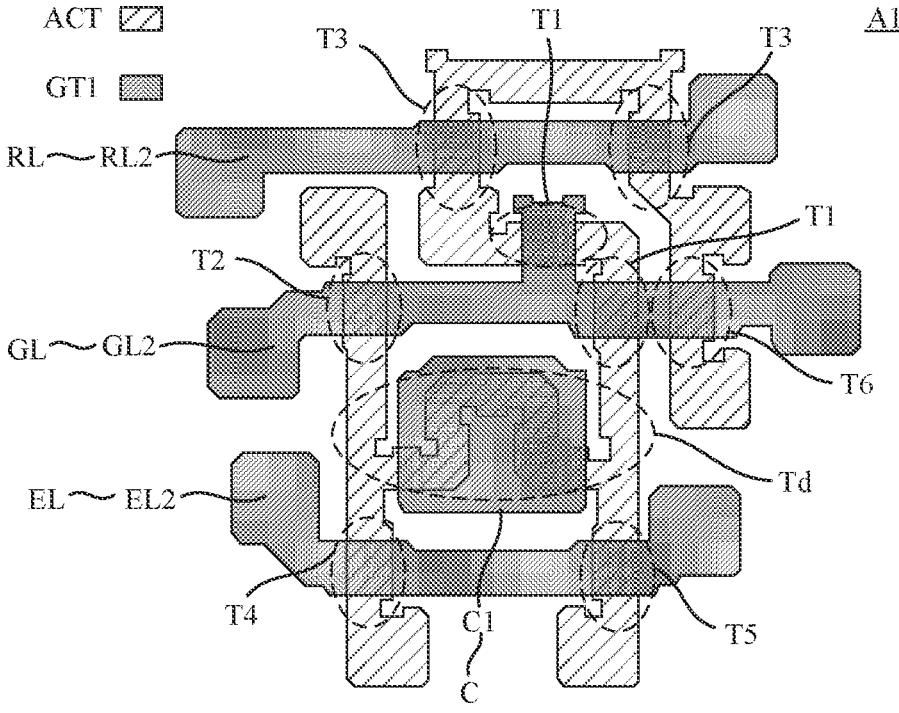
FIG. 9 is a top view of the semiconductor layer with a first gate conductive layer added thereon in the functional device setting region shown in FIG. 8.
Figure 12:
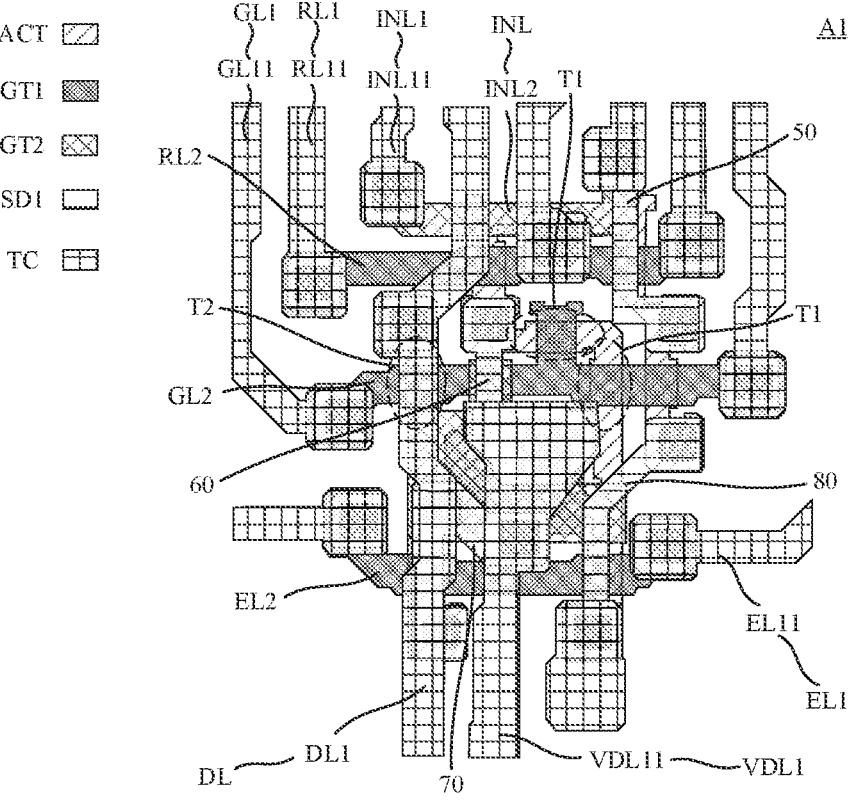
FIG. 12 is a top view of the first source-drain conductive layer with a transparent conductive layer added thereon in the functional device setting region shown in FIG. 11.

In some embodiments, referring to FIGS. 9, 12 and 16, the scan signal line GL include a first scan wiring GL1 and a first transfer line GL2. The first transfer line GL2 extends substantially in the second direction Y, and is electrically connected to the first pixel circuit 135. An end of the first scan wiring GL1 extends into the functional device setting region A1, and is electrically connected to the first transfer line GL2, so as to avoid a cross interference generated by the wiring arrangement of the scan signal lines GL and other signal lines (e.g., the data lines DL).

On this basis, in the functional device setting region A1, a portion of the first scan wiring GL1 located in the functional device setting region A1 is transparent, so as to improve the light transmittance of the functional device setting region A1 of the display panel 200.

For example, as shown in FIGS. 12 and 16, the first scan wiring GL1 includes a first sub-scan wiring GL11 and a second sub-scan wiring GL12. The first sub-scan wiring GL11 is located in the functional device setting region A1, and the second sub-scan wiring GL12 is located in the main display region A2. The first sub-scan wiring GL11 is transparent, and the second sub-scan wiring GL12 may be transparent or opaque.

In some embodiments, referring to FIGS. 9, 12 and 16, the reset signal line RL includes a first reset wiring RL1 and a second transfer line RL2. The second transfer line RL2 extends substantially in the second direction Y, and is electrically connected to the first pixel circuit 135. An end of the first reset wiring RL1 extends into the functional device setting region A1, and is electrically connected to the second transfer line RL2, so as to avoid a cross interference generated by the wiring arrangement of the reset signal lines RL and other signal lines (e.g., the data lines DL).

On this basis, in the functional device setting region A1, a portion of the first reset wiring RL1 located in the functional device setting region A1 is transparent, so as to improve the light transmittance of the functional device setting region A1 of the display panel 200.

For example, as shown in FIGS. 12 and 16, the first reset wiring RL1 includes a first sub-reset wiring RL11 and a second sub-reset wiring RL12. The first sub-reset wiring RL11 is located in the functional device setting region A1, and the second sub-reset wiring RL12 is located in the main display region A2. The first sub-reset wiring RL11 is transparent, and the second sub-reset wiring RL12 may be transparent or opaque.

In some embodiments, referring to FIGS. 9, 12 and 16, the enable signal line EL includes a first enable wiring EL1 and a third transfer line EL2. The third transfer line EL2 extends substantially in the second direction Y, and is electrically connected to the first pixel circuit 135. An end of the first enable wiring EL1 extends into the functional device setting region A1, and is electrically connected to the third transfer line EL2, so as to avoid a cross interference generated by the wiring arrangement of the enable signal lines EL and other signal lines (e.g., data lines DL).

On this basis, in the functional device setting region A1, a portion of the first enable wiring EL1 located in the functional device setting region A1 is transparent, so as to improve the light transmittance of the functional device setting region A1 of the display panel 200.

For example, as shown in FIGS. 12 and 16, the first enable wiring EL1 includes a first sub-enable wiring EL11 and a second sub-enable wiring EL12. The first sub-enable wiring EL11 is located in the functional device setting region A1, and the second sub-enable wiring EL12 is located in main display region A2. The first sub-enable wiring EL11 is transparent, and the second sub-enable wiring EL12 may be transparent or opaque.

Figure 17:
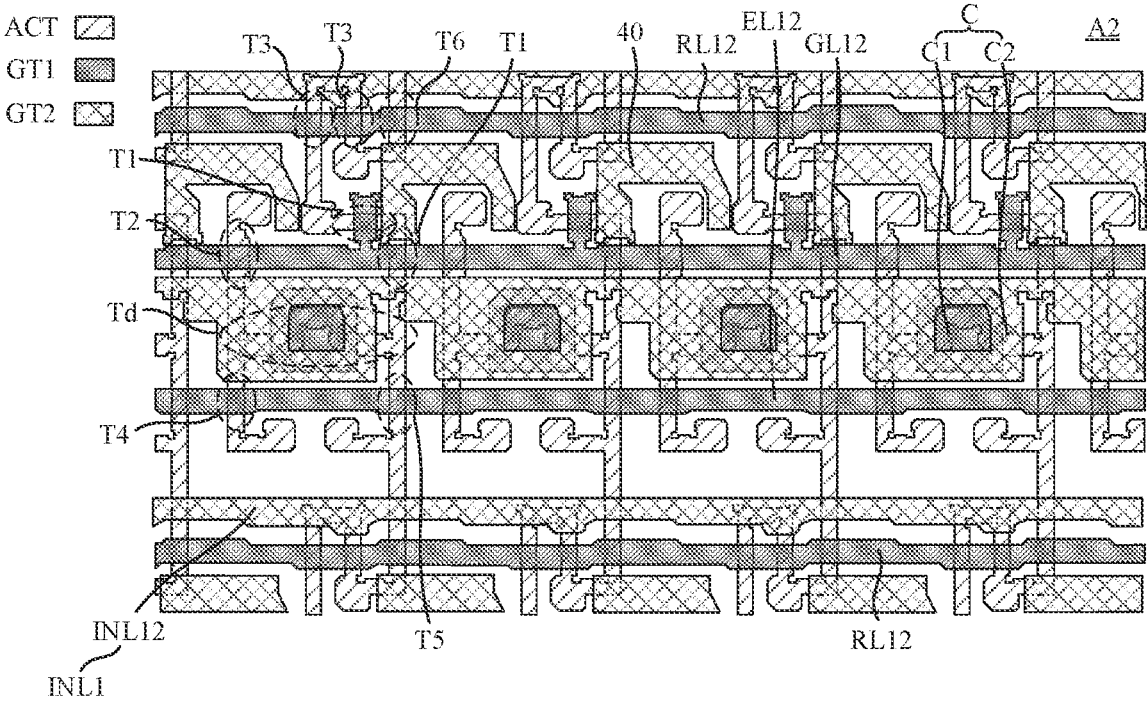
FIG. 17 is a top view of the first gate conductive layer with a second gate conductive layer added thereon in the main display region shown in FIG. 16.

In some embodiments, referring to FIGS. 10, 12 and 17, the initialization signal line INL includes a first initialization wiring INL1 and a fourth transfer line INL2. The fourth transfer line INL2 extends substantially in the second direction Y, and is electrically connected to the first pixel circuit 135. An end of the first initialization wiring INL1 extends into the functional device setting region A1, and is electrically connected to the fourth transfer line INL2, so as to avoid a cross interference generated by the wiring arrangement of the initialization signal lines INL and other signal lines (e.g., the data lines DL).

On this basis, in the functional device setting region A1, a portion of the first initialization wiring INL1 located in the functional device setting region A1 is transparent, so as to improve the light transmittance of the functional device setting region A1 of the display panel 200.

For example, as shown in FIGS. 12 and 17, the first initialization wiring INL1 includes a first sub-initialization wiring INL11 and a second sub-initialization wiring INL12. The first sub-initialization wiring INL11 is located in the functional device setting region A1, and the second sub-initialization wiring INL12 is located in the main display region A2. The first sub-initialization wiring INL11 is transparent, and the second sub-initialization wiring INL12 may be transparent or opaque.

Figure 20:
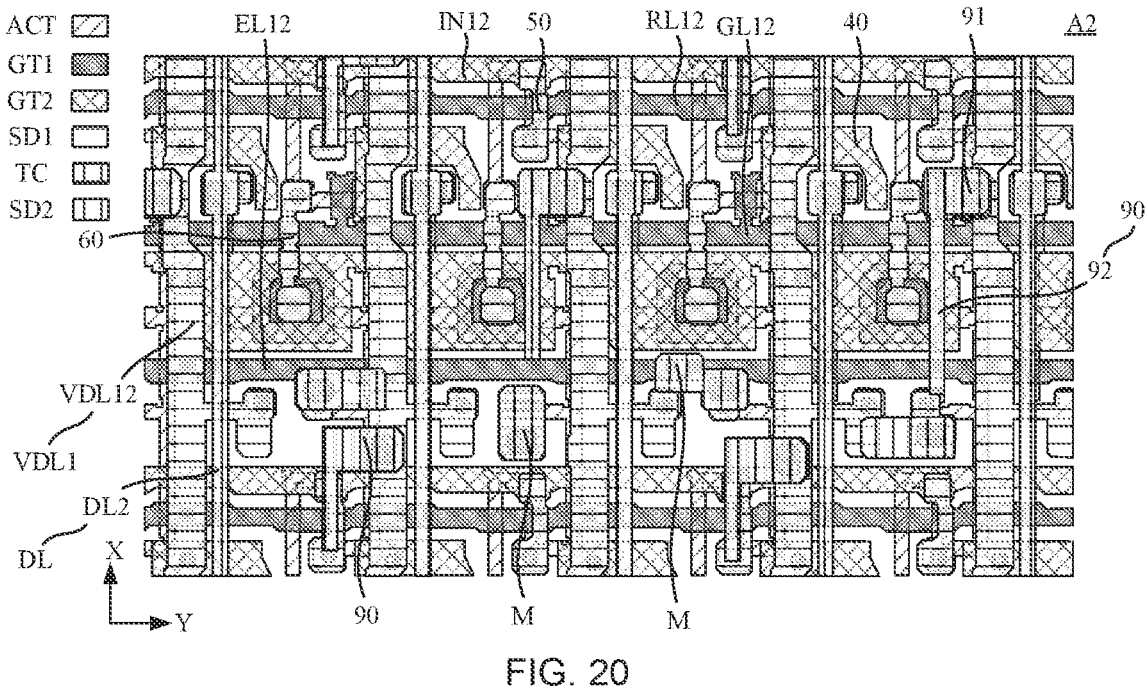
FIG. 20 is a top view of the transparent conductive layer with a second source-drain conductive layer added thereon in the main display region shown in FIG. 19.

In some embodiments, referring to FIGS. 13 and 20, the first voltage signal line VDL and the data line DL extend substantially in the first direction X (see FIGS. 6B and 7B). In the functional device setting region A1, at least a portion of each of the first voltage signal line VDL and the data line DL located in the functional device setting region A1 is transparent, so as to improve the light transmittance of the functional device setting region A1 of the display panel 200.

For example, as shown in FIGS. 13 and 20, the first voltage signal line VDL includes a first voltage wiring VDL1 and a fifth transfer line VDL2. The fifth transfer line VDL2 is disposed on a side of the first pixel circuit 135 away from the substrate 11, and is electrically connected to the first voltage wiring VDL1. That is, the fifth transfer line VDL2 crosses over the first pixel circuit 135 (see FIG. 6A). In this case, when the first voltage signal line VDL passes over the first pixel circuit 135 (see FIG. 6A), an electromagnetic interference may be reduced by increasing a distance between the first voltage signal line VDL and the first pixel circuit 135 (see FIG. 6A) through the fifth transfer line VDL2.

On this basis, as shown in FIGS. 13 and 20, the first voltage wiring VDL1 may include a first sub-voltage wiring VDL11 and a second sub-voltage wiring VDL12. The first sub-voltage wiring VDL11 is located in the functional device setting region A1, and the second sub-voltage wiring VDL12 is located in the main display region A2. The data line DL includes a first sub-data line DL1 and a second sub-data line DL2. The first sub-data line DL1 is located in the functional device setting region A1, and the second sub-data line DL2 is located in the main display region A2. The first sub-voltage wiring VDL11 and the first sub-data line DL1 may be transparent.

Signal lines included in each film layer and some other patterned film layers will be exemplarily described below with reference to the film layer structure of the display substrate 10.

Figure 21:
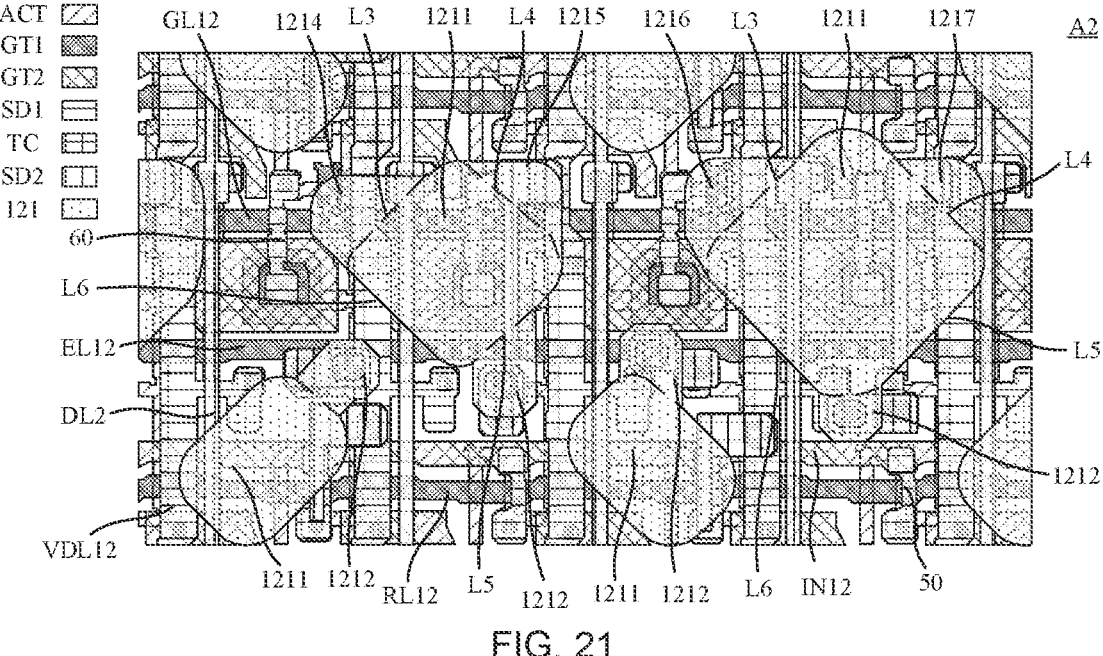
FIG. 21 is a top view of the second source-drain conductive layer with first electrodes added thereon in the main display region shown in FIG. 20.

As shown in FIGS. 14 and 21, in the direction perpendicular to the substrate 11 and away from the substrate 11, the display substrate 10 sequentially includes a semiconductor layer ACT, a first gate conductive layer GT1, a second gate conductive layer GT2, a first source-drain conductive layer SD1, a transparent conductive layer TC and a second source-drain conductive layer SD2.

It will be noted that in the semiconductor layer ACT, the first gate conductive layer GT1, the second gate conductive layer GT2, the first source-drain conductive layer SD1, the transparent conductive layer TC and the second source-drain conductive layer SD2, every two adjacent layers are provided with an insulating film layer therebetween, e.g., referring to FIG. 3, a first gate insulating layer GI1, a second gate insulating layer GI2, an interlayer insulating layer ILD, a first planarization layer PLN1, and a second planarization layer PLN2, which is not specifically limited herein in the embodiments of the present disclosure.

As shown in FIGS. 3, 8 and 15, the semiconductor layer ACT includes channel regions S, sources 131 (not shown in FIGS. 8 and 15) and drains 132 (not shown in FIGS. 8 and 15) of transistors 130 in the pixel circuits 13.

It will be noted that a material of the semiconductor layer ACT includes amorphous silicon, monocrystalline silicon, polycrystalline silicon, or a metal oxide semiconductor material. For example, the material of the semiconductor layer ACT includes indium gallium zinc oxide (IGZO) and/or zinc oxide (ZnO), which is not limited thereto.

As shown in FIGS. 9 and 16, the first gate conductive layer GT1 includes first transfer lines GL2, second transfer lines RL2, third transfer lines EL2, second sub-scan wirings GL12, second sub-reset wirings RL12, second sub-enable wirings EL12 and first electrode plates C1 of storage capacitors C. That is, the first transfer lines GL2, the second transfer lines RL2, the third transfer lines EL2, the second sub-scan wirings GL12, the second sub-reset wirings RL12, the second sub-enable wirings EL12 and the first electrode plates C1 of the storage capacitors C are arranged in the same layer, and are located in the first gate conductive layer GT1.

It will be noted that a material of the first gate conductive layer GT1 includes metal. For example, the material of the first gate conductive layer GT1 includes at least one of aluminum, copper and molybdenum, which is not limited thereto. That is, the material of the first transfer lines GL2, the second transfer lines RL2, the third transfer lines EL2, and the first electrode plates C1 of the storage capacitors C include metal.

Referring to FIG. 9, portions, overlapped with the semiconductor layer ACT, of the first transfer lines GL2 respectively constitute control electrodes of the first transistors T1, the second transistors T2 and the sixth transistors T6. Portions, overlapped with the semiconductor layer ACT, of the second transfer lines RL2 respectively constitute the control electrodes of the third transistors T3. Portions, overlapped with the semiconductor layer, of the third transfer lines EL2 respectively constitute the control electrodes of the fourth transistors T4 and the fifth transistors T5. The first electrode plate C1 of the storage capacitor C located in the functional device setting region A1 is located between the first transfer line GL2 and the third transfer line EL2.

In addition, referring to FIG. 16, portions, overlapped with the semiconductor layer ACT, of the second sub-reset wirings RL12 respectively constitute the control electrodes of the third transistors T3 and the sixth transistors T6. Portions, overlapped with the semiconductor layer, of the second sub-scan wirings GL12 respectively constitute the control electrodes of the first transistors T1 and the second transistors T2.

Portions, overlapped with the semiconductor layer ACT, of the second sub-enable wirings EL12 respectively constitute the control electrodes of the fourth transistors T4 and the fifth transistors T5. The first electrode plate C1 of the storage capacitor C located in the main display region A2 is located between the second sub-scan wiring GL12 and the second sub-enable wiring EL12.

As shown in FIGS. 10 and 17, the second gate conductive layer GT2 includes fourth transfer lines INL2, second sub-initialization wirings INL12 and second electrode plates C2 of the storage capacitors C. An orthographic projection of the second electrode plate C2 on the substrate 11 is partially overlapped with an orthographic projection of the first electrode plate C1 on the substrate 11.

In the main display region A2, the second electrode plate C2 has a hollow structure, and the orthographic projection of the first electrode plate C1 in the second pixel circuit 136 on the substrate 11 has a portion that is non-overlapped with the orthographic projection of the second electrode plate C2 in the second pixel circuit 136 on the substrate 11. The non-overlapped portion is located at a center of the orthographic projection of the second electrode plate C2 on the substrate 11, so that the first electrode plate C1 in the second pixel circuit 136 is electrically connected to the second electrode of the first transistor T1 and the second electrode of the third transistor T3. In the functional device setting region A1, the second electrode plate C2 has a solid structure, and the orthographic projection of the first electrode plate C1 in the first pixel circuit 135 on the substrate 11 has a portion that is non-overlapped with the orthographic projection of the second electrode plate C2 in the first pixel circuit 135 on the substrate 11. The non-overlapped portion is located at an edge of the orthographic projection of the second electrode plate C2 on the substrate 11, so that the first electrode plate C1 in the first pixel circuit 135 is electrically connected to the second electrode of the first transistor T1 and the second electrode of the third transistor T3.

It will be noted that a material of the second gate conductive layer GT2 includes metal. For example, the material of the second gate conductive layer GT2 includes at least one of aluminum, copper and molybdenum, which is not limited thereto.

Referring to FIGS. 10 and 17, an overlapping portion of the orthographic projection of the second electrode plate C2 on the substrate 11 and the orthographic projection of the first electrode plate C1 on the substrate 11 constitutes the storage capacitor C. The fourth transfer lines INL2 are electrically connected to the third transistors T3 and the sixth transistors T6 in the first pixel circuits 135 through connection lines. The second sub-initialization wirings INL12 are electrically connected to the third transistors T3 and the sixth transistors T6 in the second pixel circuits 136 through connection lines.

Figure 18:
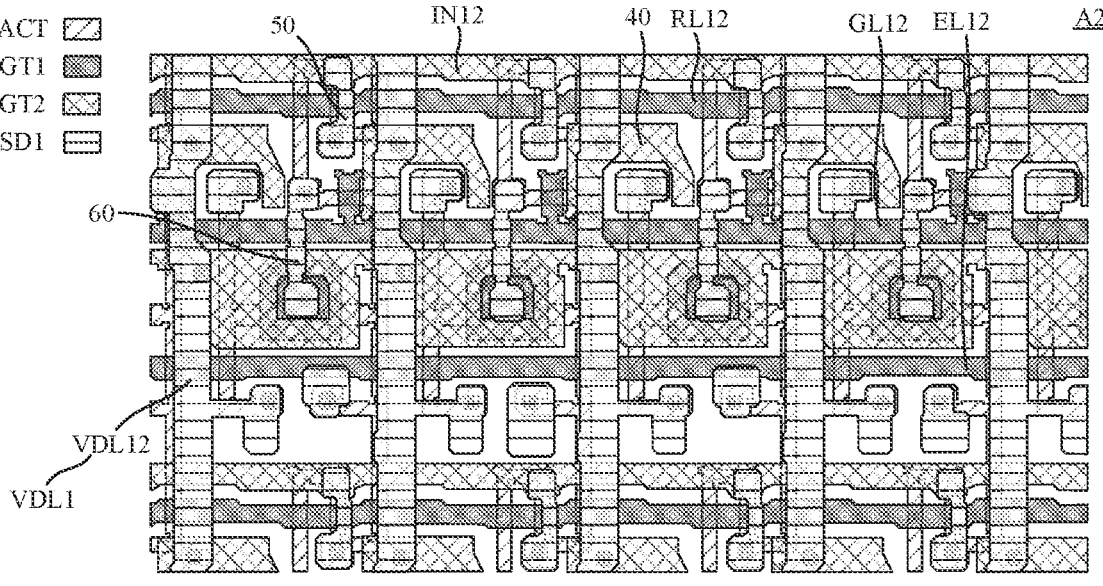
FIG. 18 is a top view of the second gate conductive layer with a first source-drain conductive layer added thereon in the main display region shown in FIG. 17.

In some embodiments, referring to FIGS. 17 and 18, the second gate conductive layer GT2 further includes shielding patterns 40 located in the main display region A2, and the shielding pattern is located between the second sub-reset wiring RL12 and the second sub-scan wiring GL12. An orthographic projection of the shielding pattern 40 on the substrate 11 is at least partially overlapped with an orthographic projection of the second sub-voltage wiring VDL12 on the substrate 11, and the shielding pattern 40 is electrically connected to the second sub-voltage wiring VDL12, so as to reduce the electromagnetic interference between the wirings.

Figure 11:
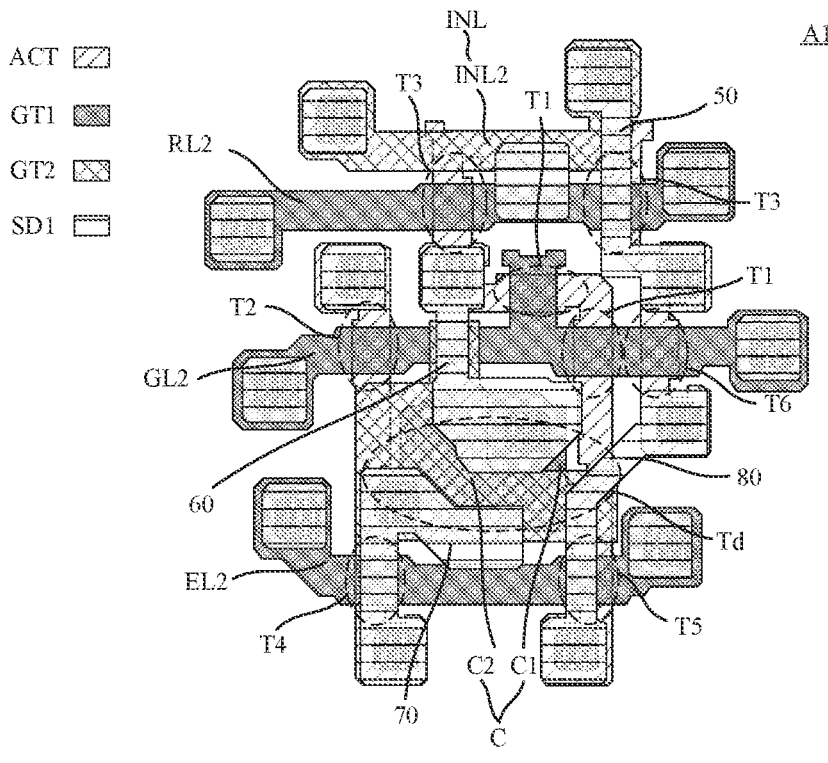
FIG. 11 is a top view of the second gate conductive layer with a first source-drain conductive layer added thereon in the functional device setting region shown in FIG. 10.

As shown in FIGS. 11 and 18, the first source-drain conductive layer SD1 includes first connection lines 50, second connection lines 60, third connection lines 70, fourth connection lines 80 and second sub-voltage wirings VDL12. The first connection lines 50 and the second connection lines 60 are distributed in both the functional device setting region A1 and the main display region A2, and the third connection lines 70 and the fourth connection lines 80 are distributed only in the functional device setting region A1.

It will be noted that a material of the first source-drain conductive layer SD1 includes metal. For example, the material of the first source-drain conductive layer SD1 includes at least one of aluminum, copper and molybdenum, which is not limited thereto.

In the functional device setting region A1, as shown in FIGS. 10, 11 and 14, the first connection line 50 is electrically connected to the first electrode of the third transistor T3 and the first electrode of the sixth transistor T6. The second connection line 60 is electrically connected to the first electrode plate C1 of the storage capacitor C, the second electrode of the first transistor T1, and the second electrode of the third transistor T3. The third connection line 70 is electrically connected to the second electrode plate C2 of the storage capacitor C and the first electrode of the fourth transistor T4. The fourth connection line 80 is electrically connected to the second electrode of the fifth transistor T5, the second electrode of the sixth transistor T6, and the first electrode 121 of the first light-emitting device 124 (see FIG. 6B).

It will be noted that the second connection line 60 is electrically connected to a portion of the first electrode plate C1 of the storage capacitor C whose orthographic projection on the substrate 11 is non-overlapped with the orthographic projection of the second electrode plate on the substrate 11.

In the main display region A2, as shown in FIGS. 17 and 18, the first connection line 50 is electrically connected to the first electrode of the third transistor T3 and the first electrode of the sixth transistor T6. The second connection line 60 is electrically connected to the first electrode plate C1 of the storage capacitor C, the second electrode of the first transistor T1, and the second electrode of the third transistor T3.

Figure 19:
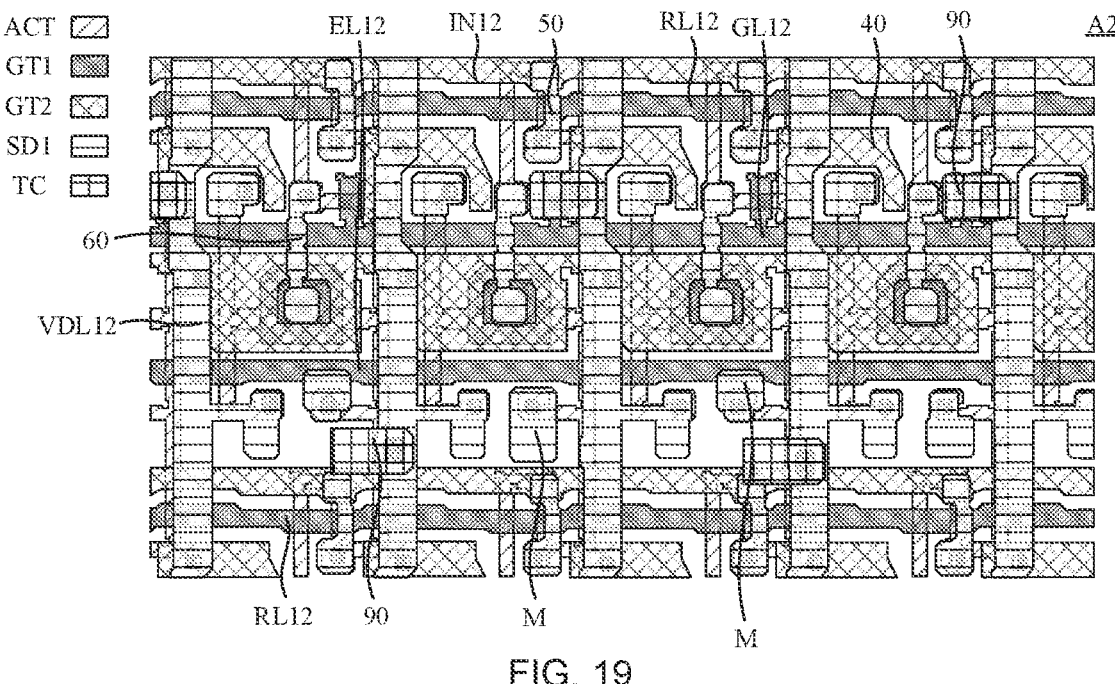
FIG. 19 is a top view of the first source-drain conductive layer with a transparent conductive layer added thereon in the main display region shown in FIG. 18.

As shown in FIGS. 12 and 19, at least a portion of each of the first scan wiring GL1, the first reset wiring RL1, the first enable wiring EL1, the first initialization wiring INL1, the data line DL and the first voltage signal line VDL located in the functional device setting region A1 is transparent.

For example, as shown in FIGS. 12 and 19, the transparent conductive layer TC includes first sub-scan wirings GL11, first sub-reset wirings RL11, first sub-enable wirings EL11, first sub-initialization wirings INL11, first sub-voltage wirings VDL11 and first sub-data lines DL1.

The first sub-voltage wiring VDL11 may be electrically connected to the second electrode plate C2 of the storage capacitor C. Orthographic projections of the first electrode plate C1 of the storage capacitor C and the second connection line 60 on the substrate 11 are overlapped with orthographic projections of the second electrode plate C2 of the storage capacitor C and the first sub-voltage wiring VDL11 on the substrate 11.

In this way, two capacitors connected in parallel may be formed to increase the capacitance.

It will be noted that a material of the transparent conductive layer TC includes a transparent conductive material, and a light transmittance of the transparent conductive layer TC made of the transparent conductive material is greater than or equal to 60%. For example, the material of the transparent conductive layer TC includes indium tin oxide, which is not limited thereto in the embodiments of the present disclosure.

As shown in FIGS. 13 and 20, the fifth transfer line VDL2 and the second sub-data line DL2 may be located in the second source-drain conductive layer SD2.

It will be noted that a material of the second source-drain conductive layer SD2 includes metal. For example, the material of the second source-drain conductive layer SD2 includes at least one of aluminum, copper and molybdenum, which is not limited thereto.

In addition, referring to FIG. 20, the second source-drain conductive layer SD2 may further include support patterns 90 located in the main display region A2.

For example, the support pattern 90 includes a first sub-support portion 91 extending in the second direction Y and a second sub-support portion 92 extending in the first direction X. An orthographic projection of the first electrode of the second light-emitting device 125 on the substrate 11 is overlapped with orthographic projections of the second sub-data line DL2 and the second sub-support portion 92 on the substrate 11. For example, the second sub-support portion 92 and the second sub-data line DL2 are respectively disposed on two sides of the second pixel circuit 136 side by side, so as to support and balance the first electrode 121 of the light-emitting device 12, thereby improving a flatness and reducing a risk of color shift. Moreover, the support pattern 90 may be electrically connected to the second sub-voltage wiring VDL12, which may further function to reduce the electromagnetic interference between the signal lines.

It will be noted that the support pattern 90 and the second sub-voltage wiring VDL12 may be directly electrically connected, or may be indirectly electrically connected through a transfer pad disposed in the transparent conductive layer TC, which is not specifically limited herein in the embodiments of the present disclosure.

Based on the above, the pad M of the pixel circuit 13 may be composed of one or more welding patterns formed in the first source-drain conductive layer SD1, the transparent conductive layer TC and the second source-drain conductive layer SD2. For example, the pad M is formed by sequentially stacking a welding pattern in the first source-drain conductive layer SD1, a welding pattern in the transparent conductive layer TC, and a welding pattern in the second source-drain conductive layer SD2.

The foregoing descriptions are merely some specific implementation manners of the present disclosure, but the protection scope of the present disclosure is not limited thereto. Changes or replacements that any person skilled in the art could conceive of within the technical scope of the present disclosure shall all be included in the protection scope of the present disclosure. Therefore, the protection scope of the present disclosure shall be subject to the protection scope of the claims.

What is claimed is:

1. A display substrate having a functional device setting region and a main display region at least partially surrounding the functional device setting region, wherein a light transmittance of the functional device setting region is greater than a light transmittance of the main display region; the display substrate comprising:

a substrate;

scan signal lines disposed on the substrate;

a plurality of first pixel circuits disposed on the substrate and located in the functional device setting region; wherein at least one first pixel circuit in the plurality of first pixel circuits includes a first transistor and a driving transistor; a control electrode of the first transistor is electrically connected to a scan signal line, a first electrode of the first transistor is electrically connected to a second electrode of the driving transistor, and a second electrode of the first transistor is electrically connected to a control electrode of the driving transistor; and a plurality of first light-emitting devices disposed on a side of the plurality of first pixel circuits away from the substrate and located in the functional device setting region; wherein each of at least one first light-emitting device in the plurality of first light-emitting devices includes a first electrode, a first electrode of a first light-emitting device in the at least one first light-emitting device is electrically connected to a first pixel circuit in the at least one first pixel circuit;

wherein the at least one first light-emitting device includes at least one first color light-emitting device, and the at least one first pixel circuit includes at least one first color pixel circuit, and a first color pixel circuit is electrically connected to a first color light-emitting device; an orthographic projection of a channel region of a first transistor in the first color pixel circuit on the substrate is at least partially overlapped with an orthographic projection of a first electrode of the first color light-emitting device on the substrate;

wherein a first electrode of each of the at least one first color light-emitting device includes a body portion that is substantially in a shape of a long strip;

the at least one first color light-emitting device includes a plurality of first color light-emitting devices including first color sub-light-emitting devices and second color sub-light-emitting devices; a first color sub-light-emitting device has a long side in a first oblique direction, and a second color sub-light-emitting device has a long side in a second oblique direction; the first oblique direction and the second oblique direction intersect;

one of the first color sub-light-emitting device and the second color sub-light-emitting device is a set light-emitting device, and a first electrode of the set light-emitting device further includes a first light-shielding portion; the orthographic projection, on the substrate, of the channel region of the first transistor in the first color pixel circuit electrically connected to the set light-emitting device is located within an orthographic projection of the first light-shielding portion on the substrate.

2. The display substrate according to claim 1, wherein of the first electrode of the set light-emitting device, a body portion includes a first long side and a second long side arranged opposite to each other, and the first light-shielding portion is located on a side of the first long side of the body portion away from the second long side and is connected to the first long side of the body portion; and the orthographic projection, on the substrate, of the channel region of the first transistor in the first color pixel circuit electrically connected to the set light-emitting device is located on a side of an orthographic projection of the first long side of the body portion on the substrate away from an orthographic projection of the second long side on the substrate.

3. The display substrate according to claim 1, wherein another one of the first color sub-light-emitting device and the second color sub-light-emitting device except the set light-emitting device is a non-set light-emitting device; and an orthographic projection, on the substrate, of a channel region of a first transistor in a first color pixel circuit in the at least one first color pixel circuit electrically connected to the non-set light-emitting device is located within an orthographic projection of a body portion of a first electrode of the non-set light-emitting device on the substrate.

4. The display substrate according to claim 1, wherein in a direction perpendicular to the substrate and away from the substrate, the display substrate sequentially comprises a first gate conductive layer, a second gate conductive layer and a first source-drain conductive layer;

the first pixel circuit further includes a storage capacitor, and the storage capacitor of the first pixel circuit includes a first electrode plate located in the first gate conductive layer and a second electrode plate located in the second gate conductive layer; the second electrode plate of the storage capacitor in the first pixel circuit has a solid structure, and an orthographic projection of the second electrode plate of the storage capacitor in the first pixel circuit on the substrate is partially overlapped with an orthographic projection of the first electrode plate of the storage capacitor in the first pixel circuit on the substrate; and the first electrode plate of the storage capacitor in the first pixel circuit has a portion whose orthographic projection on the substrate is non-overlapped with the orthographic projection of the second electrode plate in the first pixel circuit on the substrate; and the display substrate further comprises a second connection line located in the first source-drain conductive layer; the second connection line is electrically connected to the portion of the first electrode plate of the storage capacitor in the first pixel circuit whose orthographic projection on the substrate is non-overlapped with the orthographic projection of the second electrode plate on the substrate, and is electrically connected to the second electrode of the first transistor.

5. The display substrate according to claim 4, wherein the first pixel circuit further includes a sixth transistor; a control electrode of the sixth transistor is electrically connected to a scan signal terminal, a first electrode of the sixth transistor is electrically connected to an initialization signal terminal, and a second electrode of the sixth transistor is electrically connected to the first electrode of the first light-emitting device; and the display substrate further comprises a fourth connection line located in the first source-drain conductive layer, and the fourth connection line is electrically connected to the first electrode of the first light-emitting device and the second electrode of the sixth transistor.

6. The display substrate according to claim 4, further comprising a transparent conductive layer and a first voltage signal line; wherein the transparent conductive layer is disposed on a side of the first source-drain conductive layer away from the substrate; the first voltage signal line is electrically connected to the first pixel circuit;

the first voltage signal line includes a first sub-voltage wiring and a fifth transfer line located in the functional device setting region; the fifth transfer line is disposed on a side of the first pixel circuit away from the substrate, and is electrically connected to the first sub-voltage wiring; wherein the first sub-voltage wiring is located in the transparent conductive layer, and is electrically connected to the second electrode plate of the storage capacitor; orthographic projections of the first electrode plate of the storage capacitor and the second connection line on the substrate are overlapped with orthographic projections of the second electrode plate of the storage capacitor and the first sub-voltage wiring on the substrate.

7. The display substrate according to claim 6, wherein the first voltage signal line further includes a second sub-voltage wiring located in the main display region, and the second sub-voltage wiring is located in the first source-drain conductive layer;

the display substrate further comprises a plurality of second light-emitting devices, a second source-drain conductive layer, a support pattern and a data line; the plurality of second light-emitting devices are located in the main display region, and the second source-drain conductive layer is disposed on a side of the transparent conductive layer away from the substrate; the data line includes a second sub-data line located in the main display region; wherein the second sub-data line and the support pattern are located in the second source-drain conductive layer, and the support pattern includes a first sub-support portion extending in a second direction and a second sub-support portion extending in a first direction; the first direction is approximately perpendicular to the second direction; the first oblique direction and the second oblique direction each intersect with the first direction and the second direction; an orthographic projection of a first electrode of a second light-emitting device on the substrate is overlapped with orthographic projections of the second sub-data line and the second sub-support portion on the substrate.

8. The display substrate according to claim 1, wherein the first pixel circuits are arranged in a plurality of rows each including first pixel circuits arranged in a second direction; in a first direction, first pixel circuits in a row are staggered from first pixel circuits in an adjacent row; wherein the first direction is approximately perpendicular to the second direction; the first oblique direction and the second oblique direction each intersect with the first direction and the second direction;

and/or the first electrode of each of the at least one first color light-emitting device further includes a connection portion electrically connected to a first color pixel circuit in the at least one first color pixel circuit.

9. The display substrate according to claim 1, wherein the at least one first light-emitting device further includes a plurality of second color light-emitting devices and a plurality of third color light-emitting devices; and the at least one first pixel circuit further includes a second color pixel circuit electrically connected to a second color light-emitting device and a third color pixel circuit electrically connected to a third color light-emitting device; orthographic projections of channel regions of first transistors in the second color pixel circuit and the third color pixel circuit on the substrate are respectively located within orthographic projections of first electrodes of the second color light-emitting device and the third color light-emitting device on the substrate;

and/or borders of corners of the first electrode are arc-shaped.

10. The display substrate according to claim 1, further comprising:

a plurality of second pixel circuits disposed on the substrate and located in the main display region; wherein the second pixel circuits each include a first transistor and a driving transistor; a control electrode of a first transistor in a second pixel circuit is electrically connected to a scan signal line, a first electrode of the first transistor in the second pixel circuit is electrically connected to a second electrode of a driving transistor in the second pixel circuit, and a second electrode of the first transistor in the second pixel circuit is electrically connected to a control electrode of the driving transistor in the second pixel circuit; and a plurality of second light-emitting devices disposed on a side of the second pixel circuits away from the substrate and located in the main display region; wherein each second light-emitting device includes a first electrode electrically connected to a second pixel circuit in the plurality of second pixel circuits;

wherein orthographic projections of channel regions of first transistors in the plurality of second pixel circuits on the substrate are respectively located within orthographic projections of first electrodes of the plurality of second light-emitting devices on the substrate.

11. The display substrate according to claim 10, wherein the second pixel circuits are arranged in a plurality of rows each including second pixel circuits arranged in a second direction; and in a first direction, second pixel circuits in a row are aligned with second pixel circuits in an adjacent row; wherein the first direction is approximately perpendicular to the second direction.

12. The display substrate according to claim 11, wherein the plurality of second light-emitting devices include second color light-emitting devices, third color light-emitting devices, first color sub-light-emitting devices and second color sub-light-emitting devices; the plurality of second pixel circuits include a plurality of second pixel circuit groups, and each second pixel circuit group includes a second color pixel circuit electrically connected to a second color light-emitting device, a third color pixel circuit electrically connected to a third color light-emitting device, a first sub-pixel circuit electrically connected to a first color sub-light-emitting device, and a second sub-pixel circuit electrically connected to a second color sub-light-emitting device; wherein the first sub-pixel circuit, the second color pixel circuit, the second sub-pixel circuit, and the third color pixel circuit are arranged in sequence in the second direction.

13. The display substrate according to claim 12, wherein a first electrode of the second color light-emitting device includes a body portion substantially in a shape of a rhombus; two diagonal lines of the rhombus are approximately parallel to the first direction and the second direction, respectively; wherein the first electrode of the second color light-emitting device further includes a second light-shielding portion; an orthographic projection of a channel region of a first transistor in the second sub-pixel circuit on the substrate is located within an orthographic projection of the second light-shielding portion on the substrate;

or the first electrode of the second color light-emitting device includes the body portion substantially in the shape of the rhombus; the two diagonal lines of the rhombus are approximately parallel to the first direction and the second direction, respectively; wherein the first electrode of the second color light-emitting device further includes the second light-shielding portion and a third light-shielding portion; the orthographic projection of the channel region of the first transistor in the second sub-pixel circuit on the substrate is located within the orthographic projection of the second light-shielding portion on the substrate; an orthographic projection of a channel region of a first transistor in the second color pixel circuit on the substrate is located within an orthographic projection of the third light-shielding portion on the substrate;

or the first electrode of the second color light-emitting device includes the body portion substantially in the shape of the rhombus; the two diagonal lines of the rhombus are approximately parallel to the first direction and the second direction, respectively; wherein the first electrode of the second color light-emitting device further includes the second light-shielding portion and the third light-shielding portion; the orthographic projection of the channel region of the first transistor in the second sub-pixel circuit on the substrate is located within the orthographic projection of the second light-shielding portion on the substrate, and the orthographic projection of the channel region of the first transistor in the second color pixel circuit on the substrate is located within the orthographic projection of the third light-shielding portion on the substrate; the body portion of the first electrode of the second color light-emitting device includes a first border, a second border, a third border and a fourth border connected in sequence; wherein the second light-shielding portion is located on a side of the first border of the body portion away from the third border and connected to the first border of the body portion, and the first transistor in the second sub-pixel circuit is located on the side of the first border of the body portion away from the third border; and/or the third light-shielding portion is located on a side of the second border of the body portion away from the fourth border and connected to the second border of the body portion, and the first transistor in in the second color pixel circuit is located on the side of the second border of the body portion away from the fourth border.

14. The display substrate according to claim 13, wherein a first electrode of the third color light-emitting device includes a body portion substantially in a shape of a rhombus; two diagonal lines of the rhombus are approximately parallel to the first direction and the second direction, respectively; wherein the first electrode of the third color light-emitting device further includes a fourth light-shielding portion; an orthographic projection of a channel region of a first transistor in the first sub-pixel circuit on the substrate is located within an orthographic projection of the fourth light-shielding portion on the substrate; and the first electrode of the third color light-emitting device further includes a fifth light-shielding portion; an orthographic projection of a channel region of a first transistor in the third color pixel circuit on the substrate is located within an orthographic projection of the fifth light-shielding portion on the substrate;

or the first electrode of the third color light-emitting device includes the body portion substantially in the shape of the rhombus; the two diagonal lines of the rhombus are approximately parallel to the first direction and the second direction, respectively; wherein the first electrode of the third color light-emitting device further includes the fourth light-shielding portion and the fifth light-shielding portion; the orthographic projection of the channel region of the first transistor in the first sub-pixel circuit on the substrate is located within the orthographic projection of the fourth light-shielding portion on the substrate; the orthographic projection of the channel region of the first transistor in the third color pixel circuit on the substrate is located within the orthographic projection of the fifth light-shielding portion on the substrate; the body portion of the first electrode of the third color light-emitting device includes a first border, a second border, a third border and a fourth border connected in sequence; wherein the fourth light-shielding portion is located on a side of the first border of the body portion away from the third border and connected to the first border of the body portion, and the first transistor in the first sub-pixel circuit is located on the side of the first border of the body portion away from the third border; and/or the fifth light-shielding portion is located on a side of the second border of the body portion away from the fourth border and connected to the second border of the body portion, and the first transistor in the third color pixel circuit is located on the side of the second border of the body portion away from the fourth border.

15. The display substrate according to claim 1, wherein the scan signal line includes a first scan wiring and a first transfer line, and the first transfer line is electrically connected to the first pixel circuit; an end of the first scan wiring extends into the functional device setting region, and is electrically connected to the first transfer line.

16. The display substrate according to claim 15, further comprising: a reset signal line configured to transmit a reset signal and including a first reset wiring and a second transfer line, wherein the second transfer line extends substantially in a second direction and is electrically connected to the first pixel circuit, and an end of the first reset wiring extends into the functional device setting region and is electrically connected to the second transfer line; an enable signal line configured to transmit an enable signal and including a first enable wiring and a third transfer line, wherein the third transfer line extends substantially in the second direction and is electrically connected to the first pixel circuit, and an end of the first enable wiring extends into the functional device setting region and is electrically connected to the third transfer line; and an initialization signal line configured to transmit an initialization signal and including a first initialization wiring and a fourth transfer line, wherein the fourth transfer line extends substantially in the second direction, and is electrically connected to the first pixel circuit, and an end of the first initialization wiring extends into the functional device setting region and is electrically connected to the fourth transfer line;

or the display substrate further comprising: the reset signal line configured to transmit the reset signal and including the first reset wiring and the second transfer line, wherein the second transfer line extends substantially in the second direction and is electrically connected to the first pixel circuit, and the end of the first reset wiring extends into the functional device setting region and is electrically connected to the second transfer line; the enable signal line configured to transmit the enable signal and including the first enable wiring and the third transfer line, wherein the third transfer line extends substantially in the second direction and is electrically connected to the first pixel circuit, and the end of the first enable wiring extends into the functional device setting region and is electrically connected to the third transfer line; and the initialization signal line configured to transmit the initialization signal and including the first initialization wiring and the fourth transfer line, wherein the fourth transfer line extends substantially in the second direction, and is electrically connected to the first pixel circuit, and the end of the first initialization wiring extends into the functional device setting region and is electrically connected to the fourth transfer line; and a portion, located in the functional device setting region, of each of the first scan wiring, the first reset wiring, the first enable wiring and the first initialization wiring is transparent; and/or a material of each of the first transfer line, the second transfer line, the third transfer line and the fourth transfer line includes metal.

17. The display substrate according to claim 16, wherein in a direction perpendicular to the substrate and away from the substrate, the display substrate sequentially comprises a semiconductor layer, a first gate conductive layer, a second gate conductive layer, a first source-drain conductive layer and a transparent conductive layer; wherein the first transfer line, the second transfer line and the third transfer line are located in the first gate conductive layer, and the fourth transfer line is located in the second gate conductive layer;

and/or a portion, located in the functional device setting region, of each of the first scan wiring, the first reset wiring, the first enable wiring and the first initializing wiring is located in the transparent conductive layer.

18. The display substrate according to claim 1, further comprising a first voltage signal line and a data line; wherein the first voltage signal line and the data line extend substantially in a first direction, and are electrically connected to the first pixel circuit; wherein at least a portion, located in the functional device setting region, of each of the first voltage signal line and the data line is transparent;

or the display substrate further comprising the first voltage signal line and the data line; wherein the first voltage signal line and the data line extend substantially in the first direction, and are electrically connected to the first pixel circuit; the at least a portion, located in the functional device setting region, of each of the first voltage signal line and the data line is transparent; and the first voltage signal line includes a first voltage wiring and a fifth transfer line; the fifth transfer line is disposed on a side of the first pixel circuit away from the substrate, and is electrically connected to the first voltage wiring; in a direction perpendicular to the substrate and away from the substrate, the display substrate sequentially comprises a semiconductor layer, a first gate conductive layer, a second gate conductive layer, a first source-drain conductive layer, a transparent conductive layer and a second source-drain conductive layer; a portion, located in the functional device setting region, of each of the first voltage wiring and the data line is located in the transparent conductive layer, and the fifth transfer line is located in the second source-drain conductive layer.

19. A display apparatus, comprising:

a housing; and the display substrate according to claim 1, the display substrate being disposed in the housing.

\* \* \* \* \*